US011223332B2

(12) United States Patent
Choi et al.

(10) Patent No.: US 11,223,332 B2
(45) Date of Patent: Jan. 11, 2022

(54) ELECTRONIC DEVICE FOR TUNING MODULE FOR PROCESSING RADIO FREQUENCY SIGNAL

(71) Applicant: Samsung Electronics Co., Ltd., Gyeonggi-do (KR)

(72) Inventors: Hyunseok Choi, Gyeonggi-do (KR); Jooseung Kim, Gyeonggi-do (KR); Youngmin Lee, Gyeonggi-do (KR); Hyoseok Na, Gyeonggi-do (KR)

(73) Assignee: Samsung Electronics Co., Ltd

( * ) Notice: Subject to any disclaimer, the term of this patent is extended or adjusted under 35 U.S.C. 154(b) by 82 days.

(21) Appl. No.: 16/733,996

(22) Filed: Jan. 3, 2020

(65) Prior Publication Data

US 2020/0220506 A1    Jul. 9, 2020

(30) Foreign Application Priority Data

Jan. 3, 2019  (KR) .................. 10-2019-0000812

(51) Int. Cl.
| | |
|---|---|
| *H03F 3/191* | (2006.01) |
| *H03F 1/56* | (2006.01) |
| *H03F 1/02* | (2006.01) |
| *H03F 1/32* | (2006.01) |
| *H03F 3/24* | (2006.01) |
| *H04B 1/44* | (2006.01) |

(52) U.S. Cl.
CPC ............. *H03F 1/56* (2013.01); *H03F 1/0211* (2013.01); *H03F 1/32* (2013.01); *H03F 3/245* (2013.01); *H03F 2200/111* (2013.01); *H03F 2200/171* (2013.01); *H03F 2200/387* (2013.01); *H03F 2200/396* (2013.01); *H03F 2200/451* (2013.01); *H04B 1/44* (2013.01)

(58) Field of Classification Search
CPC ... H03F 3/68; H03F 3/72; H03F 3/191; H03F 3/193
USPC ............................... 330/51, 124 R, 295, 305
See application file for complete search history.

(56) References Cited

U.S. PATENT DOCUMENTS

| | | |
|---|---|---|
| 6,281,748 B1 | 8/2001 | Klomsdorf et al. |
| 6,765,443 B2 | 7/2004 | Pehike |
| | (Continued) | |

FOREIGN PATENT DOCUMENTS

| | | |
|---|---|---|
| WO | WO 2016/014214 | 1/2016 |

OTHER PUBLICATIONS

International Search Report dated Apr. 27, 2020 issued in counterpart application No. PCT/KR2020/000129, 6 pages.

(Continued)

*Primary Examiner* — Steven J Mottola
(74) *Attorney, Agent, or Firm* — The Farrell Law Firm, P.C.

(57) ABSTRACT

Disclosed is an electronic device including a power amplifier (PA) configured to amplify a transmission signal, a matching circuit configured to be connected with the PA and to form a load impedance, a filter configured to be connected with the matching circuit, and a control circuit configured to control a state of at least one of a bias of the PA, the matching circuit, and the filter. The control circuit may identify a network to which the electronic device is connected among a first network and a second network and may operate the matching circuit in one of a first state, a second state, and a third state based on the identified network.

16 Claims, 23 Drawing Sheets

(56) References Cited

U.S. PATENT DOCUMENTS

| | | | |
|---|---|---|---|
| 7,202,734 B1* | 4/2007 | Raab | H03F 3/04 |
| | | | 330/126 |
| 7,355,470 B2 | 4/2008 | Sorrells et al. | |
| 8,908,751 B2 | 12/2014 | Camuffo et al. | |
| 10,128,872 B2 | 11/2018 | Langer et al. | |
| 2011/0086630 A1 | 4/2011 | Manssen et al. | |
| 2012/0169565 A1 | 7/2012 | Morris | |
| 2013/0107914 A1 | 5/2013 | Park et al. | |
| 2014/0028521 A1 | 1/2014 | Bauder et al. | |
| 2014/0167856 A1* | 6/2014 | Takahashi | H03F 3/195 |
| | | | 330/295 |
| 2015/0024696 A1 | 1/2015 | Jin | |
| 2017/0365914 A1 | 12/2017 | Hong et al. | |
| 2018/0123533 A1 | 5/2018 | Campbell et al. | |
| 2018/0131333 A1 | 5/2018 | Cabanillas | |
| 2018/0159478 A1 | 6/2018 | Balteanu et al. | |

OTHER PUBLICATIONS

European Search Report dated May 13, 2020 issued in counterpart application No. 20150175.6-1220, 7 pages.

* cited by examiner

ELECTRONIC DEVICE FOR TUNING MODULE FOR PROCESSING RADIO FREQUENCY SIGNAL

CROSS-REFERENCE TO RELATED APPLICATIONS

This application is based on and claims priority under 35 U.S.C. § 119 to Korean Patent Application No. 10-2019-0000812, filed on Jan. 3, 2019, in the Korean Intellectual Property Office, the disclosure of which is incorporated herein by reference in its entirety.

BACKGROUND

1. Field

The disclosure relates generally to an electronic device, and more particularly, to an electronic device for tuning a module processing a radio frequency (RF) signal.

2. Description of Related Art

Electronic devices, such as a smartphone, connect to a communication network and communicate with a base station in order to provide a data service to a user. Since communication is performed by transmitting and receiving RF signals, electronic devices include a circuit for processing an RF signal. A circuit processing an RF signal needs to have performance required by a communication network. To satisfy all requirements of communication networks to be supported, the circuit may be designed to operate under any possible conditions, even though requirements of a communication network are relaxed.

Accordingly, performance optimized for a scenario for each network cannot be achieved in the conventional art, and performance (e.g., current) loss may be incurred in a nominal instance in which a linearity requirement is relaxed compared to the worst possible conditions.

Thus, there is a need in the art for a method and apparatus that mitigate such current loss in each network in certain conditions.

SUMMARY

Aspects of the disclosure are to address at least the above-mentioned problems and/or disadvantages and to provide at least the advantages described below. Accordingly, an aspect of the disclosure is to provide an electronic device for optimizing performance when a module processing an RF signal is installed in the electronic device.

Another aspect of the disclosure is to provide an electronic device that may adaptively adjust a circuit processing an RF signal according to a communication condition depending on a communication network, and may control the circuit to be reconfigurable, thus providing optimal performance for each situation.

In accordance with an aspect of the disclosure, an electronic device includes a power amplifier (PA) configured to amplify a transmission signal, a matching circuit configured to be connected with the PA and to form a load impedance, a filter configured to be connected with the matching circuit, and a control circuit configured to control a state of at least one of a bias of the PA, the matching circuit, and the filter, wherein the control circuit is configured to identify a network to which the electronic device is connected between a first network and a second network and to operate the matching circuit in one of a first state, a second state, and a third state based on the identified network, wherein the first state is defined to have a linearity corresponding to a requirement of the first network at a module level, wherein the second state is defined to have a linearity corresponding to a requirement of the second network at the module level, and wherein the third state provides a linearity that is lower than the linearity in the first state and is higher than the linearity in the second state and provides an efficiency that is higher than an efficiency in the first state and is lower than an efficiency in the second state.

In accordance with another aspect of the disclosure, an electronic device includes a PA configured to amplify a transmission signal using a plurality of amplifiers connected in parallel, a matching circuit configured to be connected with the PA and to form a load impedance, and a control circuit configured to control a state of a bias of the PA or the matching circuit, wherein the control circuit is configured to identify a power mode to be used among a first power mode and a second power mode, adjust a number of amplifiers to be turned on among the amplifiers comprised in the PA based on the identified power mode, and operate the matching circuit in one of a first state, a second state, and a third state, wherein the first state is defined to have a linearity corresponding to a requirement of a network at a module level and to enable the matching circuit to form a first impedance, wherein the second state is defined to have the linearity corresponding to the requirement of the network at the module level and to enable the matching circuit to form a second impedance higher than first impedance, and wherein the third state is defined to have the linearity corresponding to the requirement of the network at the module level and to enable the matching circuit to form a third impedance that is higher than the first impedance and is lower than the second impedance.

In accordance with another aspect of the disclosure, an electronic device includes a PA configured to amplify a transmission signal, a matching circuit configured to be connected with the PA and to form a load impedance, a filter configured to be connected with the matching circuit, an antenna switch configured to be connected with the filter, and a control circuit configured to control states of a bias of the PA, the matching circuit, the filter, and the antenna switch. When it is necessary to adjust a state that is likely to cause the PA to be damaged by a fire in order to transition to a mode for an operation, the control circuit is configured to adjust the bias of the PA to a predefined value before adjusting the state, to adjust the state, and to adjust the bias of the PA to a value according to the mode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
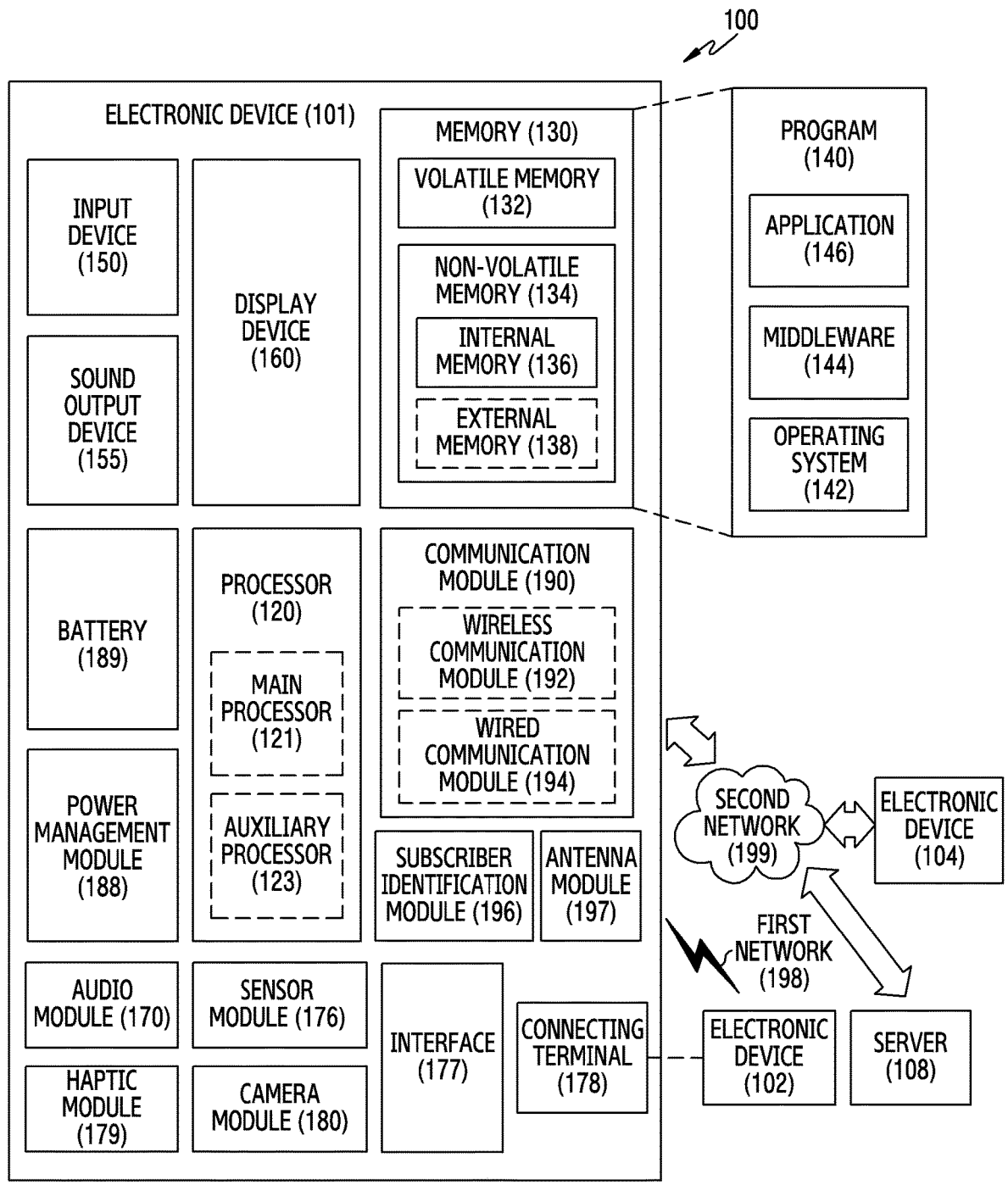
FIG. 1 illustrates an electronic device in a network environment according to an embodiment.

The following description with reference to the accompanying drawings is provided to assist in a comprehensive understanding of embodiments of the disclosure. It includes various specific details to assist in that understanding, but these are to be regarded as examples. Accordingly, those of ordinary skill in the art will recognize that various changes and modifications of the embodiments described herein can be made without departing from the scope and spirit of the disclosure. In addition, descriptions of well-known functions and constructions may be omitted for the sake of clarity and conciseness.

The electronic device according to embodiments herein may include, without limitation, a portable communication device (e.g., a smartphone), a computer device, a portable multimedia device, a portable medical device, a camera, a wearable device, or a home appliance.

It should be appreciated that embodiments of the present disclosure and the terms used therein are not intended to limit the technological features set forth herein to particular embodiments and include various changes, equivalents, or replacements for a corresponding embodiment. In the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and do not limit the components in importance or order. It is to be understood that if an element, such as a first element, is referred to, with or without the term "operatively" or "communicatively", as "coupled with," "coupled to," "connected with," or "connected to" another element, such as a second element, the first element may be coupled with the second element directly (e.g., wiredly), wirelessly, or via a third element.

FIG. 1 illustrates an electronic device 101 in a network environment 100 according to an embodiment. Referring to FIG. 1, the electronic device 101 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108.

The electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one of the components may be omitted from the electronic device 101, or one or more other components may be added in the electronic device 101. Some of the components may be implemented as single integrated circuitry. For example, the sensor module 176 may be implemented as embedded in the display device 160.

The processor 120 may execute a program 140 to control at least one other component of the electronic device 101 coupled with the processor 120, and may perform various data processing or computation. As at least part of the data processing or computation, the processor 120 may load a command or data received from another component in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. The auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component functionally related to the auxiliary processor 123.

The memory 130 may store various data used by at least one component of the electronic device 101. The various data may include the program 140 and input data or output data for a command related thereto. The memory 130 may include the volatile memory 132 or the non-volatile memory 134.

The program 140 may be stored in the memory 130 as software, and may include an operating system (OS) 142, middleware 144, and an application 146.

The input device 150 may receive a command or data to be used by another component of the electronic device 101, from the outside (e.g., a user) of the electronic device 101, and may include a microphone, a mouse, a keyboard, or a digital pen (e.g., a stylus pen).

The sound output device 155 may output sound signals to the outside of the electronic device 101. The sound output device 155 may include a speaker or a receiver. The speaker may be used for general purposes, such as playing multimedia or a record, and the receiver may be used for receiving incoming calls. The receiver may be implemented as separate from, or as part of the speaker.

The display device 160 may visually provide information to the user of the electronic device 101. The display device 160 may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the sound output device 155 or a headphone of an external electronic device 102 directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device 102 directly or wirelessly. The interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device 102. The connecting terminal 178 may include a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include a motor, a piezoelectric element, or an electric stimulator.

The camera module 180 may capture a still image or moving images and may include one or more lenses, image sensors, ISPs, or flashes.

The power management module 188 may manage power supplied to the electronic device 101 and may be implemented as at least part of a power management integrated circuit (PMIC).

The battery 189 may supply power to at least one component of the electronic device 101 and may include a primary cell which is not rechargeable, a secondary cell which is rechargeable, or a fuel cell.

The communication module 190 may support establishing a direct communication channel or a wireless communication channel between the electronic device 101 and the electronic device 102, the electronic device 104, or the server 108, and performing communication via the established communication channel. The communication module 190 may include one or more CPs that are operable independently from the processor 120 (e.g., the AP) and supports a direct communication or a wireless communication.

The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM card 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., printed circuit board (PCB)). The antenna module 197 may include a plurality of antennas. In such a case, at least one antenna appropriate for a communication scheme used in the first network 198 or the second network 199 may be selected by the wireless communication module 192 from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or service related to the request, and transfer an outcome of the performing to the electronic device 101. The electronic device 101 may provide the outcome, with or without further processing of the outcome, as at least part of a reply to the request. To that end, a cloud, distributed, or client-server computing technology may be used, for example.

In the structure of the electronic device 101 described with reference to FIG. 1, the communication module 190 may include various hardware components for performing communication, as illustrated below in FIG. 2A to FIG. 2D.

Figure 2A:
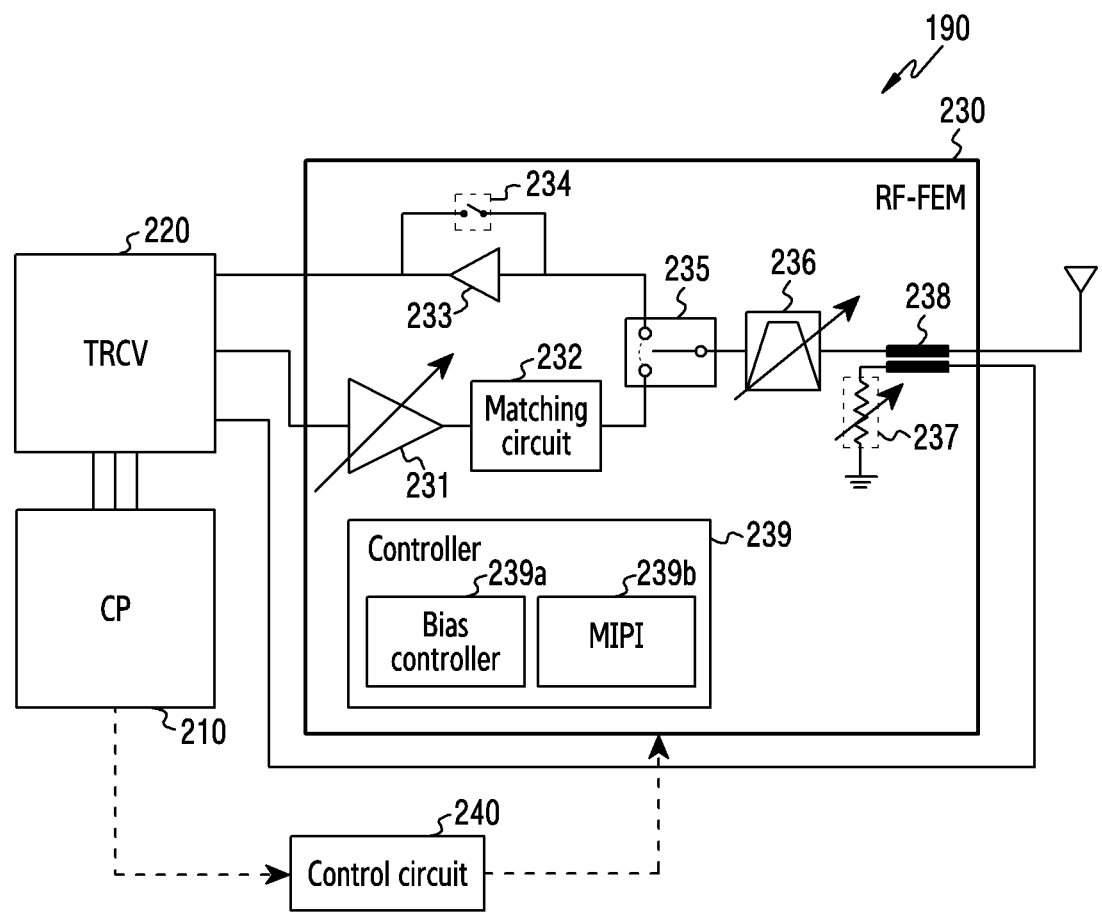
FIG. 2A illustrates an example of the configuration of a communication module in an electronic device according to an embodiment.

FIG. 2A illustrates an example of the configuration of a communication module in an electronic device according to an embodiment.

Referring to FIG. 2A, the communication module 190 may include a CP 210, a transceiver (TRCV) 220, a radio frequency-front end module (RF-FEM) 230, and/or a control circuit 240.

The CP 210 may perform control for communication and may process a digital signal. The CP 210 may control the operation or state of the transceiver 220 and/or the RF-FEM 230. For example, the CP 210 may determine the operation or state of the transceiver 220, the RF-FEM 230, and/or a component included in the transceiver 220 or the RF-FEM 230 and may generate an instruction to control the operation or state. The CP 210 may include a protocol stack for performing operations in layers defined by a communication standard. For example, the CP 210 may generate and interpret a message according to a format defined in the standard and may interact with a network based on the message. The CP 210 may process digital/baseband signals, such as by performing channel encoding/decoding and modulation/demodulation.

The transceiver 220 may process a signal for transmission or reception. The transceiver 220 may convert the frequency band of a signal and/or may amplify a signal, such as by processing an analog/intermediate frequency (IF) or RF signal. The transceiver 220 may include a digital-to-analog converter (DAC)/analog-to-digital converter (ADC), a mixer, and/or an oscillator.

The RF-FEM 230 may process an RF signal and may include a PA 231, a matching circuit 232, a low-noise amplifier (LNA) 233, and a bypass switch 234, a transceiving switch 235, a filter 236, a variable resistor 237, a coupler 238, and/or a controller 239. The PA 231 may amplify an RF signal provided from the transceiver 220. The matching circuit 232 may form load impedance. The LNA 233 may amplify a received signal, and the bypass switch 234 may be used to form a reception path without using the LNA 233. The transceiving switch 235 may connect a path including the PA 231 with the filter 236 in signal transmission and may connect a path including the LNA 233 with the filter 236 in signal reception. The filter 236 may filter a signal according to the frequency band of the signal used for communication. The variable resistor 237 may provide a resistance value necessary for the operation of the coupler 238, and the coupler 238 may couple a transmission signal. The controller 239 may generate a control signal for controlling at least one component included in the RF-FEM 230 and may include a bias controller 239*a* to control a bias current of the PA 231 and/or a mobile industry processor interface (MIPI) 239*b* for exchanging a signal with at least one component included in the RF-FEM 230.

The control circuit 240 may control at least one component included in the RF-FEM 230 according to determination by the CP 210. For example, the control circuit 240 may control the state of at least one of the PA 231, the matching circuit 232, or the filter 236 to be tuned based on a connected network or a used power mode. The control circuit 240 may measure the performance or characteristics (e.g., linearity or efficiency) of the RF-FEM 230 while the RF-FEM 230 is installed and operates in the electronic device 101. The control circuit 240 may measure the performance or characteristics of the RF-FEM 230 using a signal coupled by the coupler 238. The control circuit 240 may be referred to as a control block, a sensing circuit, a sensing and control block, a sensing and control circuit, or other terms having equivalent technical meanings.

In FIG. 2A, the control circuit 240 is illustrated as a separate component from the CP 210, the transceiver 220, and the RF-FEM 230. However, the control circuit 240 may be included in any one of the CP 210, the transceiver 220, or the RF-FEM 230.

Figure 2B:
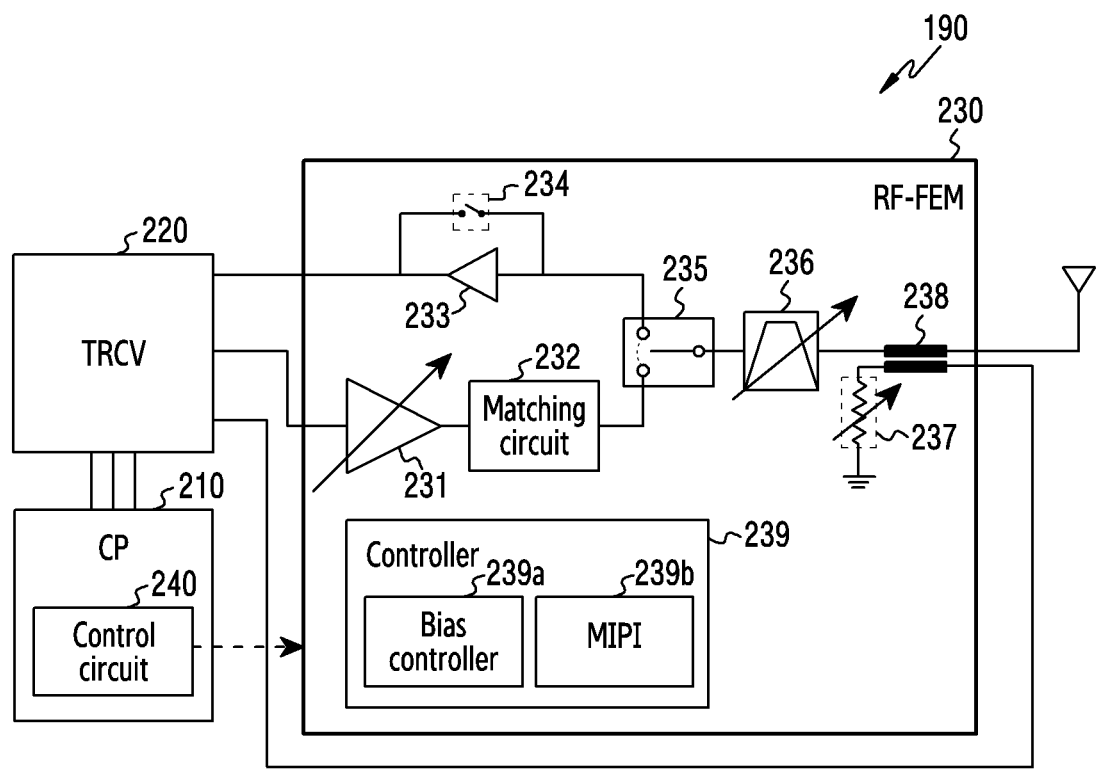
FIG. 2B illustrates an example of the configuration of a communication module in an electronic device according to an embodiment.

FIG. 2B illustrates an example of the configuration of a communication module in an electronic device according to an embodiment. In FIG. 2B, the control circuit 240 may be included in the CP 210.

Figure 2C:
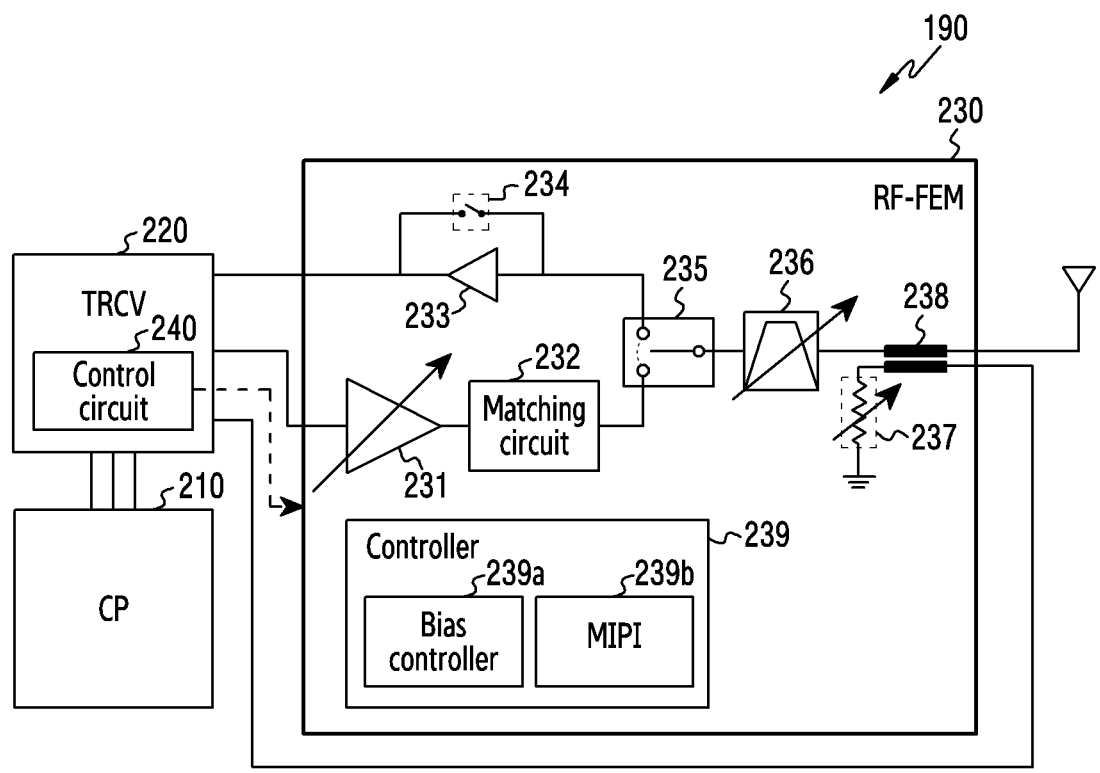
FIG. 2C illustrates an example of the configuration of a communication module in an electronic device according to an embodiment.

FIG. 2C illustrates an example of the configuration of a communication module in an electronic device according to an embodiment. In FIG. 2C, the control circuit 240 may be included in the transceiver 220.

Figure 2D:
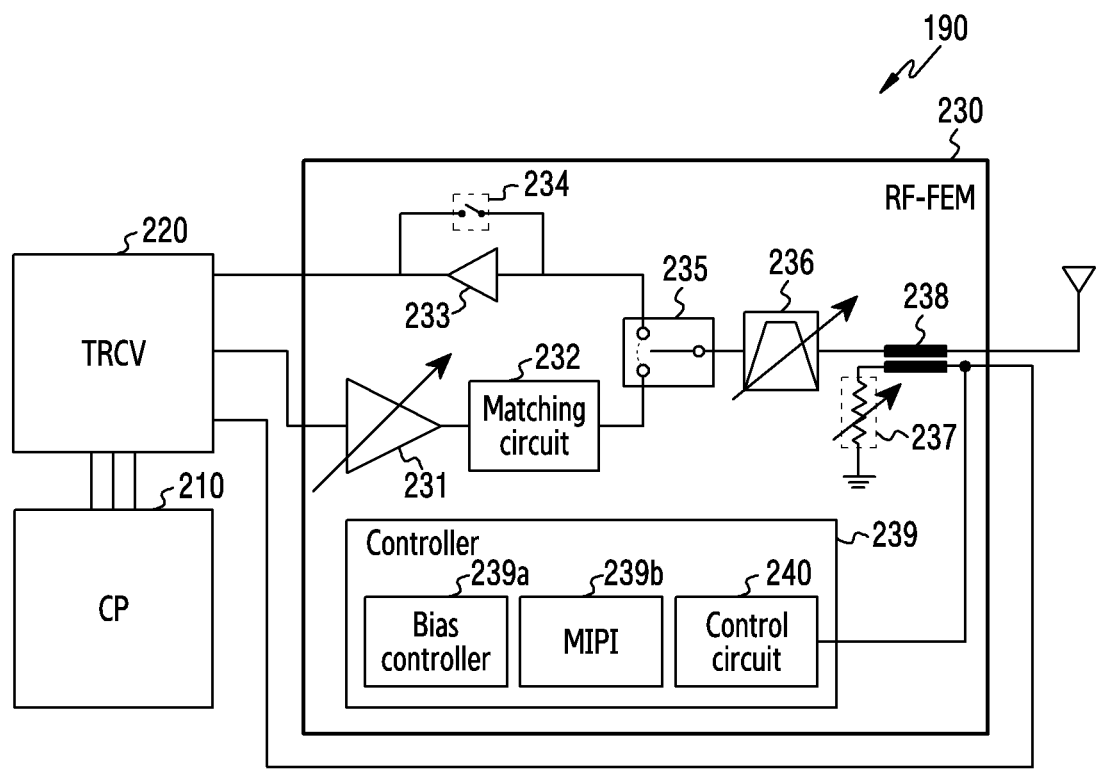
FIG. 2D illustrates an example of the configuration of a communication module in an electronic device according to an embodiment.

FIG. 2D illustrates an example of the configuration of a communication module in an electronic device according to an embodiment. In FIG. 2D, the control circuit 240 may be included in the controller 239 of the RF-FEM 230.

In FIG. 2A to FIG. 2D, the RF-FEM 230 may include the PA 231 to amplify a transmission signal. The RF-FEM 230 may further include at least one other amplifier. For example, the RF-FEM 230 may further include a pre-driver amplifier and/or a driver amplifier. In this case, an interstage matching circuit may be further included between the pre-driver amplifier and the driver amplifier or between the driver amplifier and the PA 231. The RF-FEM 230 may further include an input matching circuit.

In FIG. 2A to FIG. 2D, by controlling the matching circuit (e.g., the input matching circuit, the interstage matching circuit, or the matching circuit 232) and/or the filter 246, the characteristics (e.g., linearity or efficiency) of the RF-FEM 230 may be tuned, and the power level of a transmission signal may be adjusted. The matching circuit for tuning the characteristics of the RF-FEM 230 may be formed as shown in FIG. 3A, and the filter may be formed as shown in FIG. 3B.

Figure 3A:
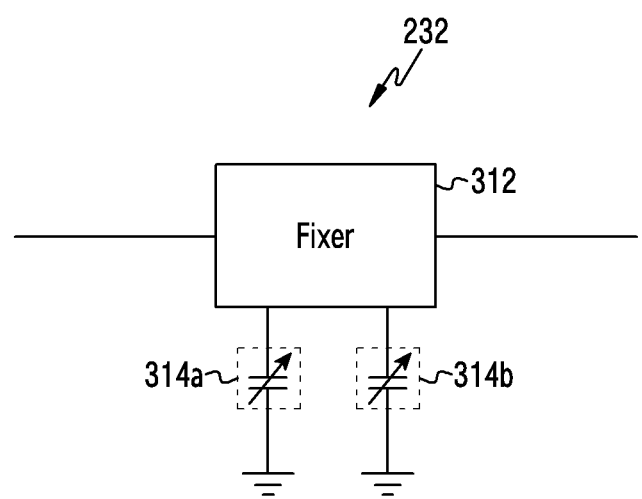
FIG. 3A illustrates an example of a matching circuit in an electronic device according to an embodiment.

FIG. 3A illustrates an example of a matching circuit in an electronic device according to an embodiment.

Referring to FIG. 3A, the matching circuit (e.g., the input matching circuit, the interstage matching circuit, or the matching circuit 232) may include the fixer 312, a first variable capacitor 314a, and/or a second variable capacitor 314b. The fixer 312 may include at least one passive circuit element (e.g., a resistor, a capacitor, and/or an inductor). The first variable capacitor 314a and/or the second variable capacitor 314b may provide adjustable capacitances, and the value of impedance formed by the matching circuit may vary by adjusting the capacitances. Although FIG. 3A illustrates two variable capacitors 314a and 314b, one capacitor or three or more capacitors may also be included.

Figure 3B:
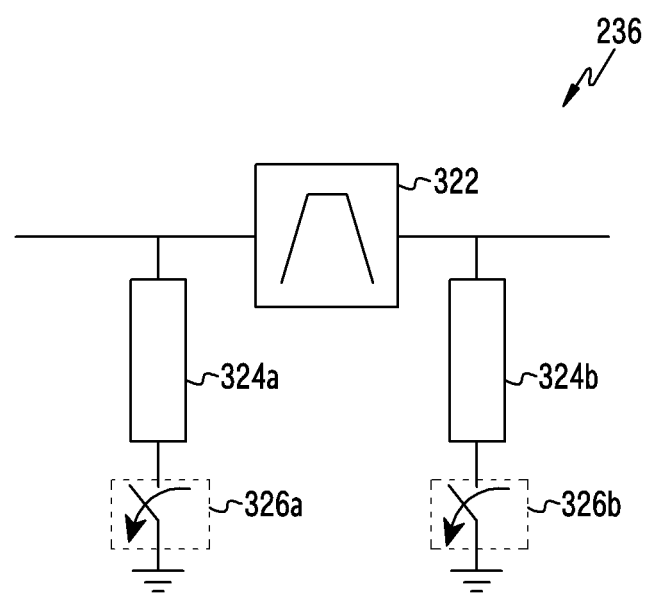
FIG. 3B illustrates an example of a filter in an electronic device according to an embodiment.

FIG. 3B illustrates an example of a filter in an electronic device according to an embodiment. Referring to FIG. 3B, the filter 236 may include a band pass filter 322, a first notch filter 324a, a second notch filter 324b, a first switch 326a, and/or a second switch 326b.

The first notch filter 324a may be connected to one end of the band pass filter 322, and the second notch filter 324b may be connected to the other end of the band pass filter 322. The first switch 326a may adjust grounding of the first notch filter 324a, and the second switch 326b may adjust grounding of the second notch filter 324b.

Figure 4:
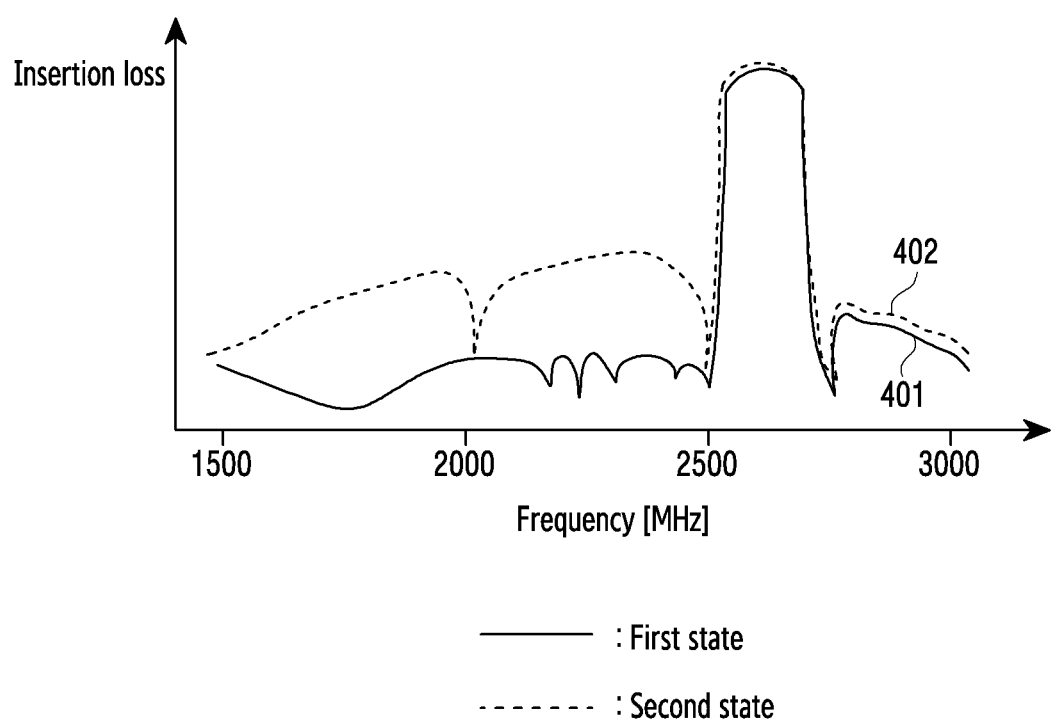
FIG. 4 illustrates an example of a characteristic change due to tuning of a filter in an electronic device according to an embodiment.

Depending on the states of the first switch 326a and the second switch 326b, the insertion loss of an RF-FEM 230 may vary as shown in FIG. 4.

FIG. 4 illustrates an example of a characteristic change due to tuning of a filter in an electronic device according to an embodiment. When both the first switch 326a and the second switch 326b are opened, an insertion loss characteristic may change from a first state 401 to a second state 402. Referring to FIG. 4, when both the first switch 326a and the second switch 326b are opened, a signal attenuation level outside a pass band may be decreased, and the insertion loss in the pass band may be reduced.

When adaptively tuning and controlling the matching circuit 232 or the filter 236 of the PA 231 depending on the communication condition, it may be difficult to secure intended performance and linearity due to the impact of matching and ground (GND) conditions at a product level rather than at a module level. Accordingly, embodiments are disclosed herein in order to solve problems that may occur in actual applications.

The linearity and the efficiency of the RF-FEM may be adjusted by adjusting load impedance using the matching circuit 232.

Figure 5:
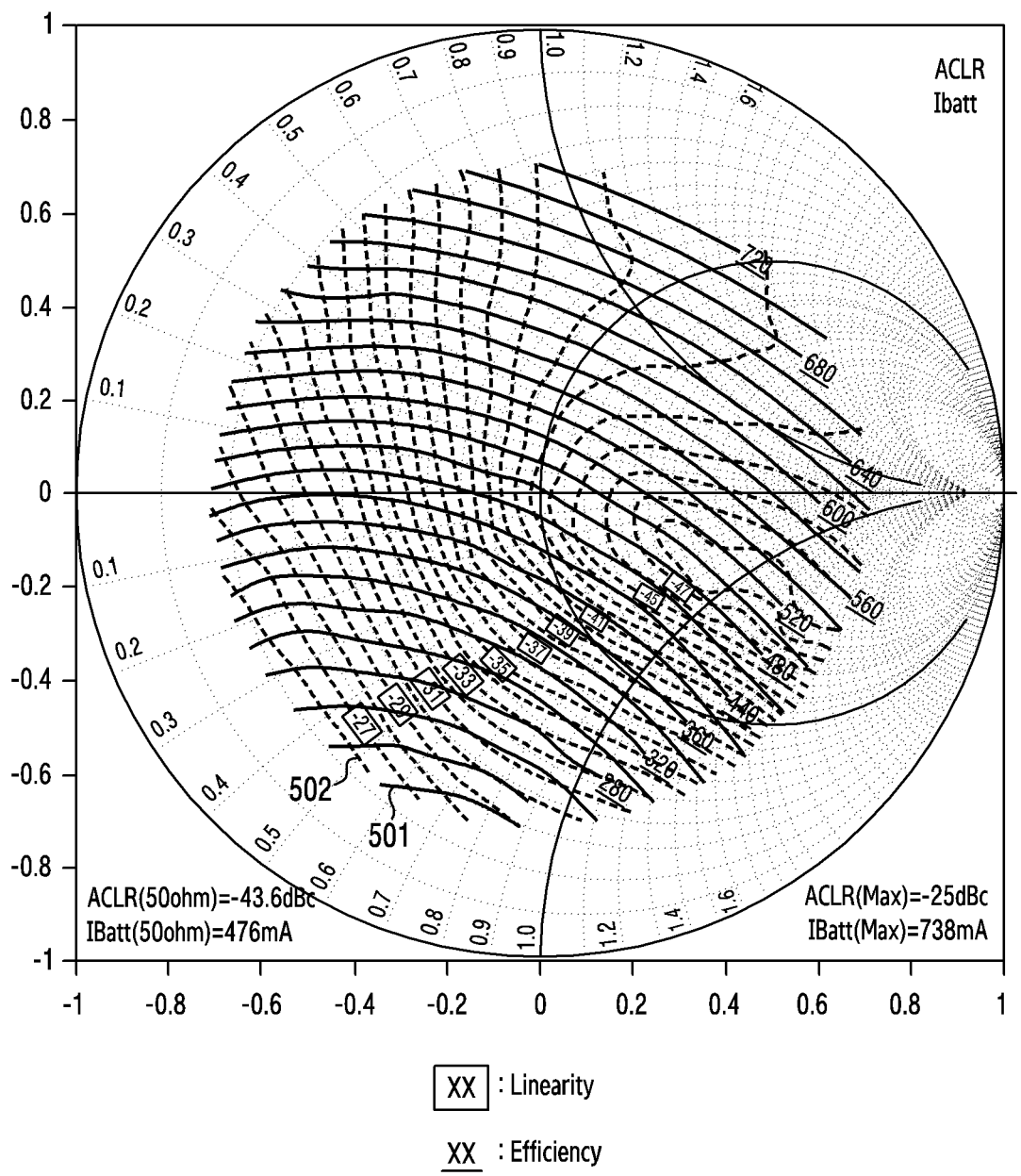
FIG. 5 illustrates an example of a characteristic change due to adjustment of the impedance value of a matching circuit in an electronic device according to an embodiment.

FIG. 5 illustrates an example of a characteristic change due to adjustment of the impedance value of a matching circuit in an electronic device according to an embodiment. In FIG. 5, solid lines 501 represent impedances providing the same efficiency, and dotted lines 502 represent impedances providing the same linearity. The linearity may be interpreted as an adjacent channel leakage ratio (ACLR) or an error vector magnitude (EVM), and the efficiency may be interpreted as the current consumption of the PA.

In FIG. 5, the linearity and the efficiency vary according to the impedance value. The linearity (e.g., ACLR or EVM) and the efficiency (e.g., current consumption) are determined according to the value of impedance formed by the matching circuit, while an impedance range in which the linearity is excellent and an impedance range in which the efficiency is excellent may not be consistent with each other. Since a change in the linearity and a change in the efficiency have different trends, the efficiency may be adjusted within a particular linearity. For example, when a linearity characteristic of ACLR=−33 is given, the efficiency may be adjusted in a range from about 280 to 640.

Figure 6:
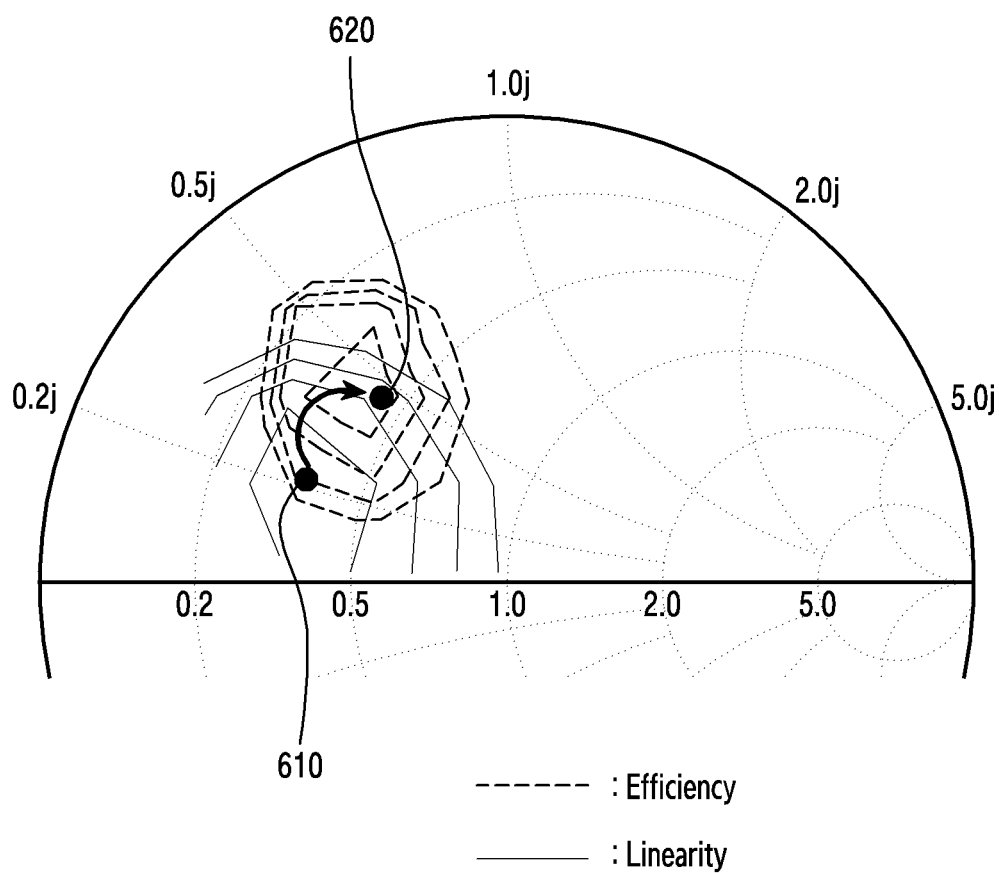
FIG. 6 illustrates another example of a characteristic change due to adjustment of the impedance value of a matching circuit in an electronic device according to an embodiment.

FIG. 6 illustrates another example of a characteristic change due to adjustment of the impedance value of a matching circuit in an electronic device according to an embodiment. In FIG. 6, the linearity may be interpreted as an ACLR or EVM, and the efficiency may be interpreted as power-added efficiency (PAE). As shown in FIG. 6, when a matching point is changed from a first point 610 to a second point 620, both the linearity and the efficiency may be excellent.

As described with reference to FIG. 5 and FIG. 6, the linearity and the efficiency of the RF-FEM may be changed by adjusting the load impedance. The linearity and the efficiency according to the load impedance may be defined at the module level of the RF-FEM. However, when the RF-FEM is installed and operates in an electronic device, a result different from the result defined at the module level may be obtained. Accordingly, after checking whether required performance (e.g., linearity) is secured even during operation, an option selectable when the performance is not secured may be used.

Figure 7:
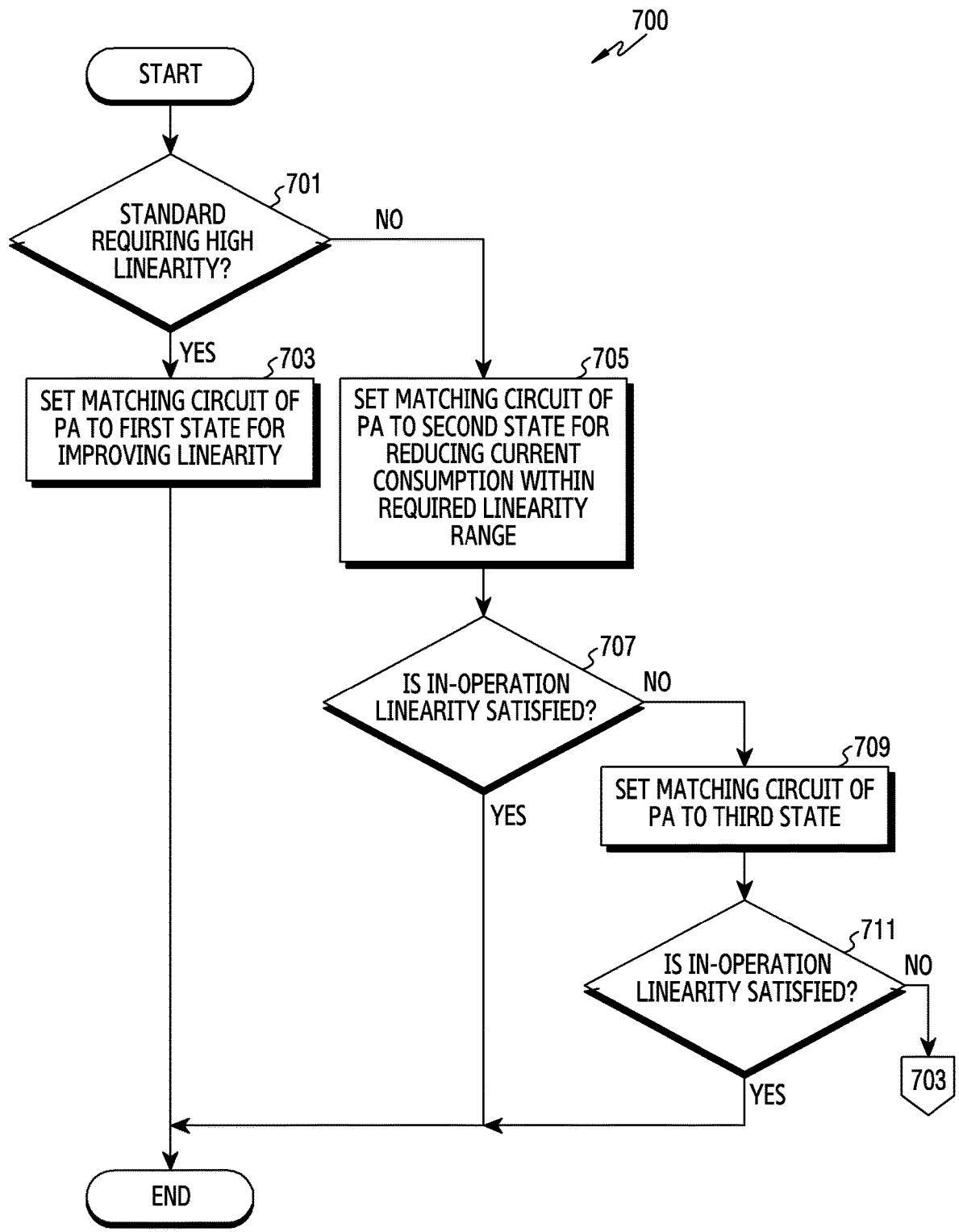
FIG. 7 illustrates a method for adjusting impedance according to a network in an electronic device according to an embodiment.

FIG. 7 illustrates a method 700 for adjusting impedance according to a network in an electronic device according to an embodiment.

Referring to FIG. 7, in step 701, the electronic device 101 may determine whether a standard requires high linearity. The control circuit 240 may identify a network that is currently connected or is to be connected based on information provided from an AP (e.g., the processor 120) or the CP 210 and may determine that the identified network is based on the standard requiring high linearity. For example, the AP may recognize a network selected by a user. In another example, the CP 210 controls an access procedure through a protocol stack and may thus recognize a network that is currently connected or is to be connected. For example, a network based on the standard requiring high linearity may be a fifth generation (5G) network, and a network based on a standard requiring relatively low linearity may be a long term evolution (LTE) network.

When the identified network is a first network based on the standard requiring high linearity, the electronic device 101 may set the matching circuit of the PA to a first state for improving linearity in step 703. The first state may be in which a set value for forming an impedance value for improving the linearity of the RF-FEM among selectable impedance value candidates is applied to the matching circuit. For example, the set value may indicate the capacitance value of a capacitor included in the matching circuit. In step 703, the set value may be selected using information about a correspondence between a combination of linearity and efficiency and a set value (e.g., a lookup table), and the information about the correspondence between the combination of linearity and efficiency and the set value may be defined at the module level of the RF-FEM.

When the identified network is a second network that is not based on the standard requiring high linearity, the electronic device 101 may set the matching circuit of the PA to a second state for reducing current consumption within a required linearity range in step 705.

The second state may be in which a set value for forming an impedance value for providing a linearity greater than a linearity required by the standard of the RF-FEM and reducing current consumption among selectable impedance value candidates is applied to the matching circuit. For example, the set value may indicate the capacitance value of a capacitor included in the matching circuit. In step 705, the set value may be selected using information about a correspondence between a combination of linearity and efficiency and a set value (e.g., a lookup table), and the information about the correspondence between the combination of linearity and efficiency and the set value may be defined at the module level of the RF-FEM.

In step 707, the electronic device 101 may determine whether an in-operation linearity is satisfied. With the matching circuit of the PA set to the second state, the electronic device 101 may measure the linearity based on output of the PA that is fed back and may determine whether the measured linearity satisfies a linearity level required by the second network. For example, the electronic device 101 may determine whether the linearity satisfies the linearity level required by the second network by comparing a linearity index (e.g., ACLR or EVM) measured during the operation with a threshold value corresponding to the second network.

When the in-operation linearity is not satisfied in the second state, the electronic device 101 may set the matching circuit of the PA to a third state in step 709. The third state may be an intermediate state for providing lower linearity than that in the first state and providing lower efficiency than that in the second state (e.g., involving current consumption higher than that in the second state). For example, a set value for the third state may indicate a third capacitance that ranges between a first capacitance indicated by the set value for the first state and a second capacitance indicated by the set value for the second state. For example, the third capacitance may be half the second capacitance.

In step 711, the electronic device 101 may determine whether the in-operation linearity is satisfied. With the matching circuit of the PA set to the third state, the electronic device 101 may measure the linearity based on output of the PA that is fed back and may determine whether the measured linearity satisfies the linearity level required by the second network. For example, the electronic device 101 may determine whether the linearity satisfies the linearity level required by the second network by comparing a linearity index (e.g., ACLR or EVM) measured during the operation with the threshold value corresponding to the second network.

When the in-operation linearity is not satisfied in the third state, the method returns to step 703 in which the electronic device 101 may set the matching circuit of the PA to the first state in which the linearity can be more improved than in the third state. For example, when the linearity is not satisfied in the intermediate state prepared for disagreement between linearity performance defined at the module level and linearity performance defined at the product level, a state in which the linearity is maximized may be used.

Figure 8:
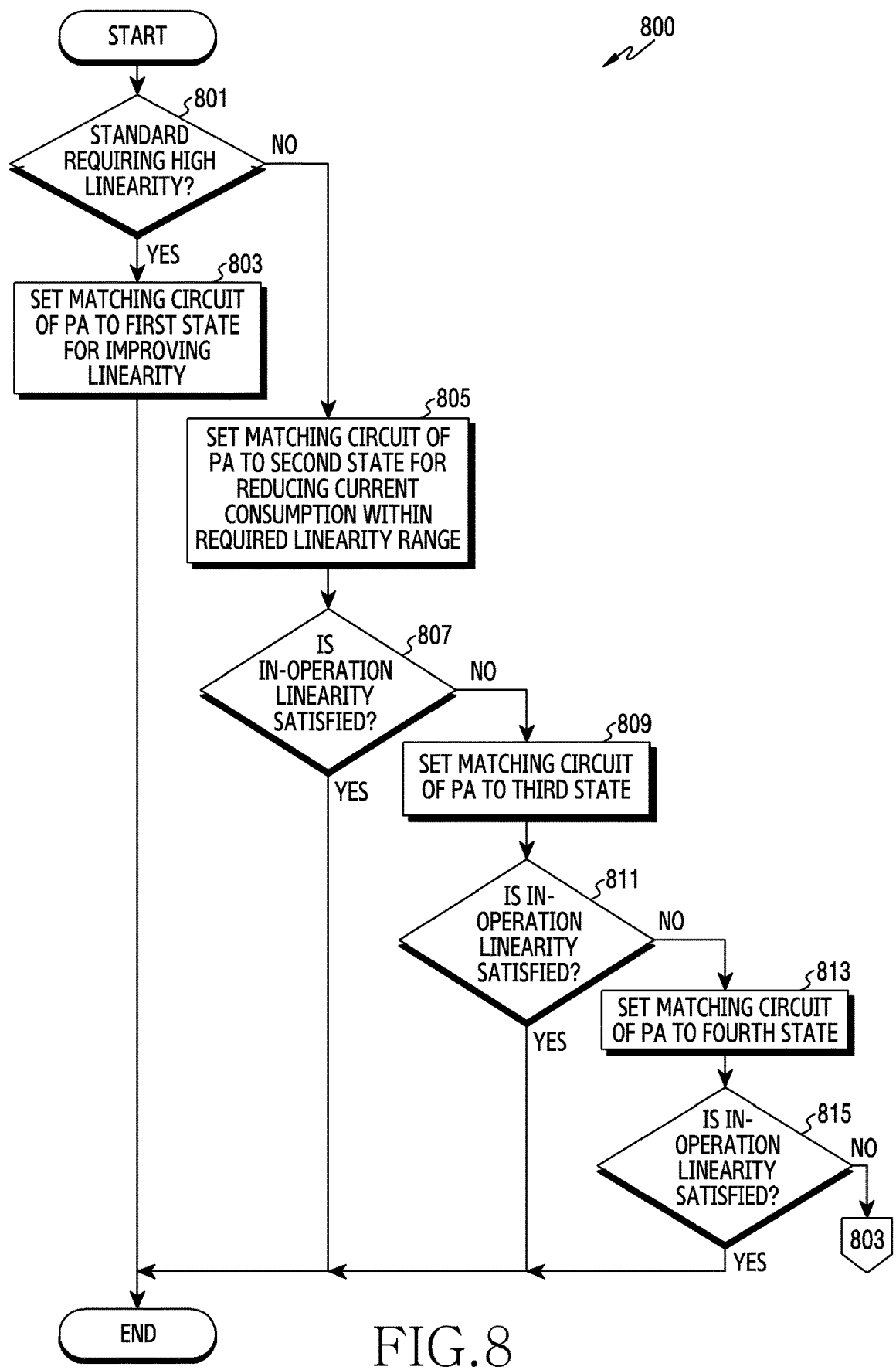
FIG. 8 illustrates a method for adjusting impedance according to a network in an electronic device according to an embodiment.

FIG. 8 illustrates a method 800 for adjusting impedance according to a network in an electronic device according to an embodiment. Unlike FIG. 7, FIG. 8 illustrates a plurality of intermediate states.

Referring to FIG. 8, in step 801, the electronic device 101 may determine whether a standard requires high linearity. The control circuit 240 may identify a network that is currently connected or is to be connected based on information provided from an AP or the CP 210 and may determine that the identified network is based on the standard requiring high linearity. For example, the AP may recognize a network selected by a user. In another example, the CP 210 controls an access procedure through a protocol stack and may thus recognize a network that is currently connected or is to be connected. For example, a network based on the standard requiring high linearity may be a 5G network, and a network based on a standard requiring relatively low linearity may be an LTE network.

When the identified network is a first network based on the standard requiring high linearity, the electronic device 101 may set the matching circuit of the PA to a first state for improving linearity in step 803. The first state may be in which a set value for forming an impedance value for improving the linearity of the RF-FEM among selectable impedance value candidates is applied to the matching circuit. For example, the set value may indicate the capacitance value of a capacitor included in the matching circuit. In step 803, the set value may be selected using information about a correspondence between a combination of linearity and efficiency and a set value (e.g., a lookup table), and the information about the correspondence between the combination of linearity and efficiency and the set value may be defined at the module level of the RF-FEM.

When the identified network is a second network that is not based on the standard requiring high linearity, the electronic device 101 may set the matching circuit of the PA to a second state for reducing current consumption within a required linearity range in step 805. The second state may be in which a set value for forming an impedance value for providing a linearity greater than a linearity required by the standard of the RF-FEM and reducing current consumption among selectable impedance value candidates is applied to the matching circuit. For example, the set value may indicate the capacitance value of a capacitor included in the matching circuit. In step 805, the set value may be selected using information about a correspondence between a combination of linearity and efficiency and a set value (e.g., a lookup table), and the information about the correspondence between the combination of linearity and efficiency and the set value may be defined at the module level of the RF-FEM.

In step 807, the electronic device 101 may determine whether an in-operation linearity is satisfied. With the matching circuit of the PA set to the second state, the electronic device 101 may measure the linearity based on output of the PA that is fed back and may determine whether the measured linearity satisfies a linearity level required by the second network. For example, the electronic device 101 may determine whether the linearity satisfies the linearity level required by the second network by comparing a linearity index (e.g., ACLR or EVM) measured during the operation with a threshold value corresponding to the second network.

When the in-operation linearity is not satisfied in the second state, the electronic device 101 may set the matching circuit of the PA to a third state in step 809. The third state may be an intermediate state for providing lower linearity than that in the first state and providing lower efficiency than that in the second state (e.g., involving higher current consumption than that in the second state). For example, a set value for the third state may indicate a third capacitance that ranges between a first capacitance indicated by the set value for the first state and a second capacitance indicated by the set value for the second state. For example, the third capacitance may be half the second capacitance.

In step 811, the electronic device 101 may determine whether the in-operation linearity is satisfied. With the matching circuit of the PA set to the third state, the electronic device 101 may measure the linearity based on output of the PA that is fed back and may determine whether the measured linearity satisfies the linearity level required by the second network. For example, the electronic device 101 may determine whether the linearity satisfies the linearity level required by the second network by comparing a linearity index measured during the operation with the threshold value corresponding to the second network.

When the in-operation linearity is not satisfied in the third state, the electronic device 101 may set the matching circuit of the PA to a fourth state in step 813. The fourth state may be another intermediate state for providing linearity that is lower than linearity in the first state and is higher than linearity in the third state and providing efficiency that is higher than efficiency in the first state and is lower than efficiency in the third state (e.g., involving current consumption that is lower than current consumption in the first state and is higher than current consumption in the third state). For example, a set value for the fourth state may indicate a fourth capacitance that ranges between the first capacitance indicated by the set value for the first state and the third capacitance indicated by the set value for the third state. For example, the fourth capacitance may be half the third capacitance.

When the in-operation linearity is not satisfied in the fourth state, the electronic device 101 may set the matching circuit of the PA to the first state in which the linearity can be more improved than in the fourth state in step 803. For example, when the linearity is not satisfied in the intermediate states prepared for disagreement between linearity performance defined at the module level and linearity performance defined at the product level, a state in which the linearity is maximized may be used.

As in the embodiments described with reference to FIG. 7 or FIG. 8, the linearity and the efficiency may be optimized by adjusting the matching circuit according to the requirement of the connected network. Alternatively, not only a bias observed in the PA but also the bias of the pre-driver amplifier, the driver amplifier, and/or the PA may be adjusted according to the required linearity. When a bias current having a voltage higher than a threshold value is applied, the PA may be biased to class A of a conventional PA, higher linearity may be ensured, and current consumption may increase. When a bias current having a voltage similar to the threshold value is applied, the PA may be biased to class B of a conventional PA, linearity may deteriorate, and current consumption may be reduced.

As in the embodiments described with reference to FIG. 7 and FIG. 8, in addition to a state in which linearity is prioritized (e.g., the first state) and a state in which efficiency is prioritized (e.g., the second state), an intermediate state (e.g., the third state or the fourth state) is defined.

Control of the linearity and the efficiency by adjusting the voltage of a bias current or the matching circuit described above may be performed in real time according to a change in an environment (e.g., an electric field and a ground) due to a network condition or a user's grip.

According to an embodiment, an electronic device includes a PA configured to amplify a transmission signal, a matching circuit configured to be connected with the PA and to form a load impedance, a filter configured to be connected with the matching circuit, and a control circuit configured to control a state of at least one of a bias of the PA, the matching circuit, or the filter. The control circuit may identify a network to which the electronic device is connected among a first network and a second network and may operate the matching circuit in one of a first state, a second state, or a third state based on the identified network, the first state may be defined to have a linearity corresponding to a requirement of the first network at a module level, the second state may be defined to have a linearity corresponding to a requirement of the second network at the module level, and the third state may be for providing a linearity that is lower than that in the first state and is higher than that in the second state and providing an efficiency that is higher than that in the first state and is lower than that in the second state.

The first network may be a network that requires a higher linearity than the second network, and the control circuit may control the matching circuit to operate in the first state when the identified network is the first network, and may control the matching circuit to operate in the second state when the identified network is the second network.

After controlling the matching circuit to operate in the second state, when a linearity measured with the matching circuit to operate in the second state does not satisfy the requirement of the second network, the control circuit may control the matching circuit to operate in the third state.

After controlling the matching circuit to operate in the third state, when a linearity measured with the matching circuit to operate in the third state does not satisfy the requirement of the second network, the control circuit may control the matching circuit to operate in the first state.

After controlling the matching circuit to operate in the third state, when a linearity measured with the matching circuit to operate in the third state does not satisfy the requirement of the second network, the control circuit may control the matching circuit to operate in a fourth state, and the fourth state may be a state for providing a linearity that is lower than that in the first state and is higher than that in the third state and providing an efficiency that is higher than that in the first state and is lower than that in the third state.

The electronic device may further include a coupler configured to couple the transmission signal having passed through the filter, wherein the control circuit may measure an in-operation linearity using the signal coupled by the coupler.

The output power and efficiency of the RF-FEM may be adjusted through the PA and the matching circuit according to the power mode. The PA and the matching circuit controlled according to the power mode may be formed as shown below in FIG. 9.

Figure 9:
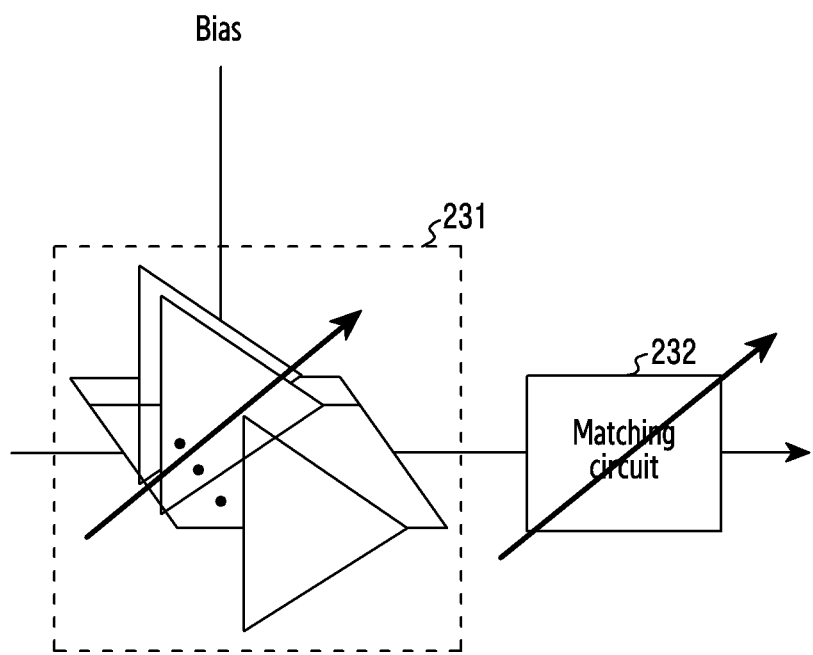
FIG. 9 illustrates an example of a power amplifier in an electronic device according to an embodiment.

FIG. 9 illustrates an example of a power amplifier in an electronic device according to an embodiment. Referring to FIG. 9, the PA 231 may include amplifiers that can be turned on/off and includes a plurality of power stages, and the amplifiers may be connected in parallel to a matching circuit 232. Operations for controlling output power and efficiency based on the PA 231 having a structure illustrated in FIG. 9 may be as illustrated in FIG. 10.

Figure 10:
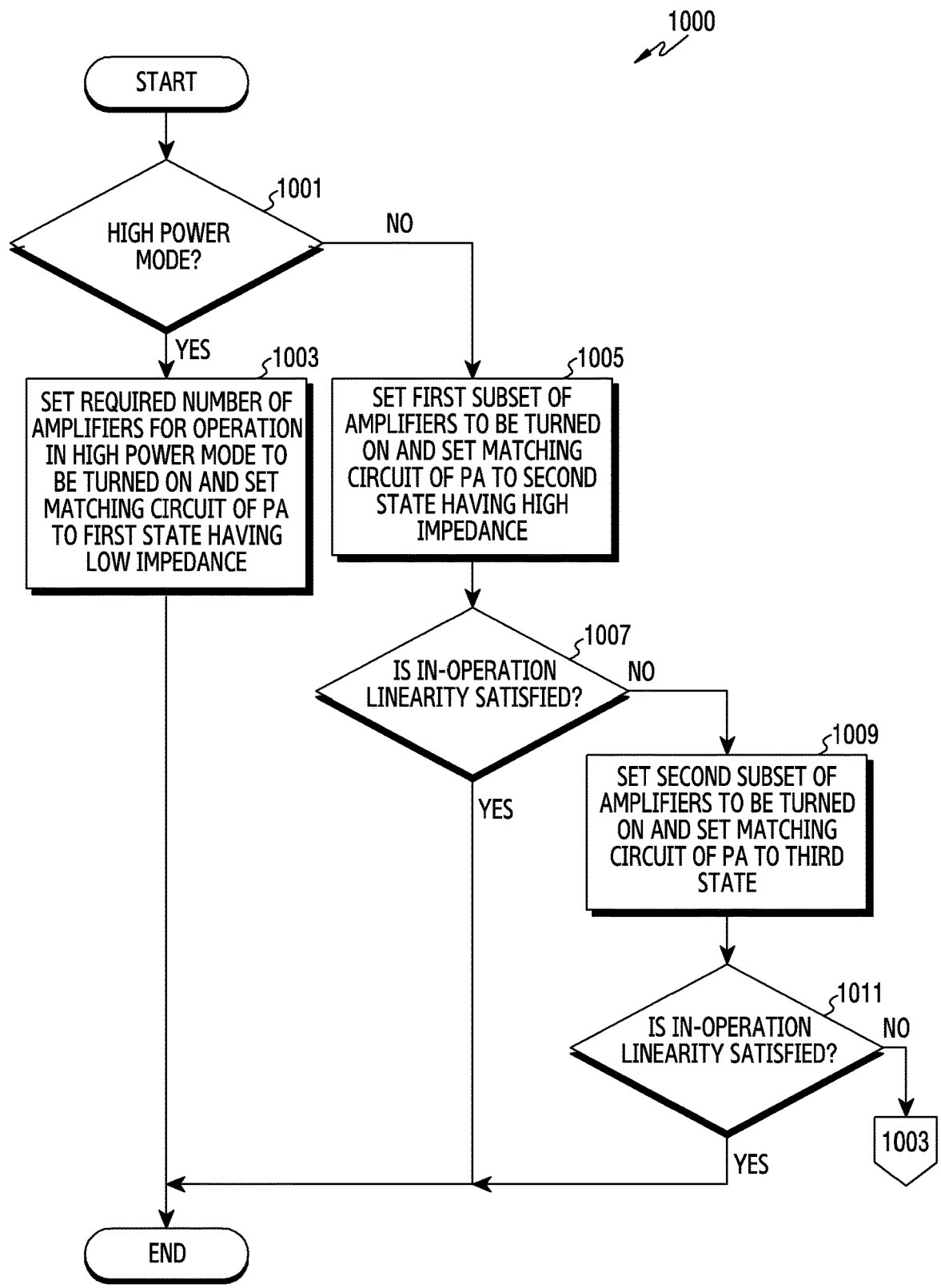
FIG. 10 illustrates a method for adjusting a power amplifier and impedance according to a power mode in an electronic device according to an embodiment.

FIG. 10 illustrates a method 1000 for adjusting a power amplifier and impedance according to a power mode in an electronic device according to an embodiment.

Referring to FIG. 10, in step 1001, the electronic device 101 may identify whether the electronic device 101 operates in a high power mode. For example, the electronic device 101 may use the high power mode or a low power mode and may identify which mode to currently use among the high power mode and the low power mode. The CP 210 may indicate whether to use the high power mode. The high power mode may refer to an operating state using transmission power that is greater than or equal to a reference level. For example, the high power mode may be used when channel quality is below a threshold value. For example, when ET amplification is performed, it may be determined that the electronic device is in the high power mode.

When operating in the high power mode, the electronic device 101 may set a required number of PAs for the operation in the high power mode to be turned on and may set a matching circuit of the PAs to a first state having low impedance in step 1003. For example, for the operation in the high power mode, all PAs may be controlled to be on. The first state may be in which a set value for forming the smallest impedance value for satisfying a different requirement (e.g., linearity) among selectable impedance value candidates is applied to the matching circuit. For example, the set value may indicate the capacitance value of a capacitor included in the matching circuit. In step 1003, the set value may be selected using information about a correspondence between linearity or efficiency and a set value (e.g., a lookup table), and the information about the correspondence between linearity or efficiency and the set value may be defined at the module level of an RF-FEM.

When not operating in the high power mode, the electronic device 101 may set a first subset of PAs to be turned on and may set the matching circuit of the PAs to a second state having high impedance in step 1005. The second state may be in which a set value for forming the largest impedance value for satisfying a different requirement (e.g., linearity) among selectable impedance value candidates is applied to the matching circuit. For example, the set value may indicate the capacitance value of a capacitor included in the matching circuit. In step 1005, the set value may be selected using information about a correspondence between linearity or efficiency and a set value, and the information about the correspondence between linearity or efficiency and the set value may be defined at the module level of the RF-FEM.

In step 1007, the electronic device 101 may determine whether an in-operation linearity is satisfied. With the first subset of PAs turned on and the matching circuit of the PAs set to the second state, the electronic device 101 may measure linearity based on output of the PAs that is fed back and may determine whether the measured linearity satisfies a linearity level required by a network. For example, the electronic device 101 may determine whether the linearity satisfies the linearity level required by the network by comparing a linearity index (e.g., ACLR or EVM) measured during the operation with a threshold value corresponding to the network.

When the in-operation linearity is not satisfied with the first subset of PAs turned on and the matching circuit of the PAs set to the second state, the electronic device 101 may set a second subset of PAs to be turned on and may set the matching circuit of the PAs to a third state in step 1009. The second subset may include a greater number of amplifiers than the first subset. The third state may be in which a set value for forming third impedance, which ranges from first impedance formed in the first state to second impedance formed in the second state, for satisfying a different requirement (e.g., linearity) among selectable impedance value candidates is applied to the matching circuit. In step 1009, the set value may be selected using information about a correspondence between linearity or efficiency and a set value, and the information about the correspondence between linearity or efficiency and the set value may be defined at the module level of the RF-FEM.

In step 1011, the electronic device 101 may determine whether the in-operation linearity is satisfied. With the second subset of PAs turned on and the matching circuit of the PAs set to the third state, the electronic device 101 may measure linearity based on output of the PAs that is fed back and may determine whether the measured linearity satisfies the linearity level required by the network. For example, the electronic device 101 may determine whether the linearity satisfies the linearity level required by the network by comparing a linearity index measured during the operation with a threshold value corresponding to the network.

When the in-operation linearity is not satisfied with the second subset of PAs turned on and the matching circuit of the PAs set to the third state, the method returns to step 1003 in which the electronic device 101 may set all the PAs to be turned on and may set the matching circuit of the PAs to the first state having the low impedance. For example, when the linearity is not satisfied in an intermediate state prepared for disagreement between linearity performance defined at the module level and linearity performance defined at the product level, a state in which the linearity is maximized may be used.

In FIG. 10, a case where the second subset of PAs is turned on and the matching circuit of the PAs is set to the third state may be used as the intermediate state. Alternatively, a plurality of intermediate states may be defined, and the electronic device 101 may apply the intermediate states so that the number of amplifiers to be turned is increased to satisfy linearity.

According to an embodiment, an electronic device includes a PA configured to amplify a transmission signal using a plurality of amplifiers connected in parallel, a matching circuit configured to be connected with the PA and to form a load impedance, and a control circuit configured to control a state of a bias of the PA or the matching circuit. The control circuit may identify a power mode to be used among a first power mode and a second power mode, may adjust the number of amplifiers to be turned on among the amplifiers included in the PA based on the identified power mode, and may operate the matching circuit in one of a first state, a second state, or a third state. The first state may be defined to have a linearity corresponding to a requirement of a network at a module level and to enable the matching circuit to form a first impedance, the second state may be defined to have the linearity corresponding to the requirement of the network at the module level and to enable the matching circuit to form a second impedance higher than first impedance, and the third state may be defined to have the linearity corresponding to the requirement of the network at the module level and to enable the matching circuit to form a third impedance that is higher than the first impedance and is lower than the second impedance.

The first power mode may use a higher transmission power than the second power mode, and the control circuit may control all the amplifiers included in the PA to be turned on and may control the matching circuit to operate in the first state when the identified power mode is the first power mode, and may control a first subset among the amplifiers included in the PA to be turned on and may control the matching circuit to operate in the second state when the identified power mode is the second power mode.

After controlling the matching circuit to operate in the second state, when a linearity measured with the matching circuit to operate in the second state does not satisfy the requirement of the network, the control circuit may control a second subset, which includes a greater number of amplifiers than the first subset among the amplifiers included in the PA, to be turned on and controls the matching circuit to operate in the third state.

After controlling the matching circuit to operate in the third state, when a linearity measured with the matching circuit to operate in the third state does not satisfy the requirement of the network, the control circuit may control all the amplifiers included in the PA to be turned on and controls the matching circuit to operate in the first state.

After controlling the matching circuit to operate in the third state, when a linearity measured with the matching circuit to operate in the third state does not satisfy the requirement of the network, the control circuit may control a third subset, which includes a greater number of amplifiers than the second subset among the amplifiers included in the PA, to be turned on and controls the matching circuit to operate in a fourth state for forming an impedance that is higher than that in the first state and is lower than that in the third state.

As described above, the characteristics of an RF-FEM may be adjusted by controlling components included in the RF-FEM. A change in the state of at least one of the components to be controlled may cause a dramatic change in load impedance, and a PA may be damaged by a fire due to reflected waves incurred by the dramatic change in load impedance. Therefore, a critical switching operation for controlling the component that causes fire damage to the PA may be performed when the PA is less affected in order to prevent the PA from being damaged by a fire.

Figure 11:
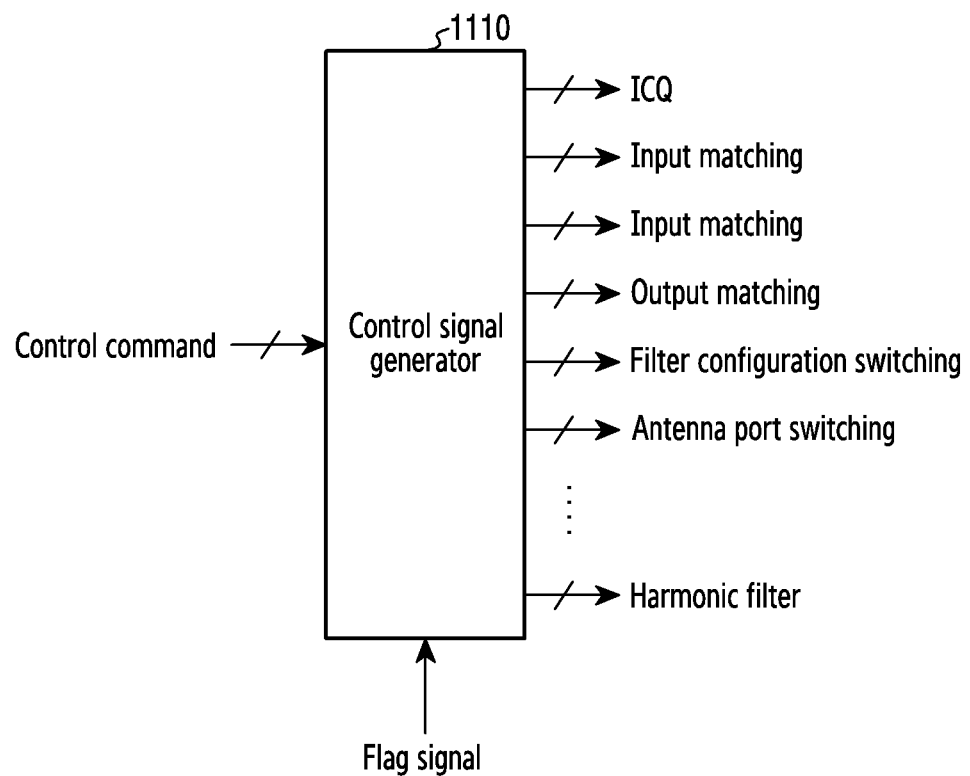
FIG. 11 illustrates an example of a module to generate control signals for adjusting the states of signal processing components in an electronic device according to an embodiment.

FIG. 11 illustrates an example of a module to generate control signals for adjusting the states of signal processing components in an electronic device according to an embodiment.

Referring to FIG. 11, the control signal generator 1110 may output at least one control signal for controlling at least some of a plurality of components based on a control command provided from a CP 210. For example, the at least one control signal may include at least one of a collector current quiescent point (ICQ) for controlling the bias current of a PA, a signal for controlling an input matching circuit, a signal for controlling an internal matching circuit, a signal for controlling an output network, a control signal for switching a filter configuration, a control signal for switching an antenna port, or a signal for controlling a harmonic filter. Antenna port switching for changing an antenna or filter configuration switching for controlling the first notch filter 324a or the second notch filter 324b may be included in switching that is likely to cause the PA to be damaged by a fire (hereinafter, "damage-causable switching").

The ICQ is a signal for controlling the bias current of a PA, and may be used to transition the PA to a state in which the PA is not significantly affected by reflected waves before and after a damage-causable switching operation. Completion of the damage-causable switching operation may be notified to the control signal generator 1110 via a flag signal. The flag signal may indicate completion of damage-causable switching.

Figure 12:
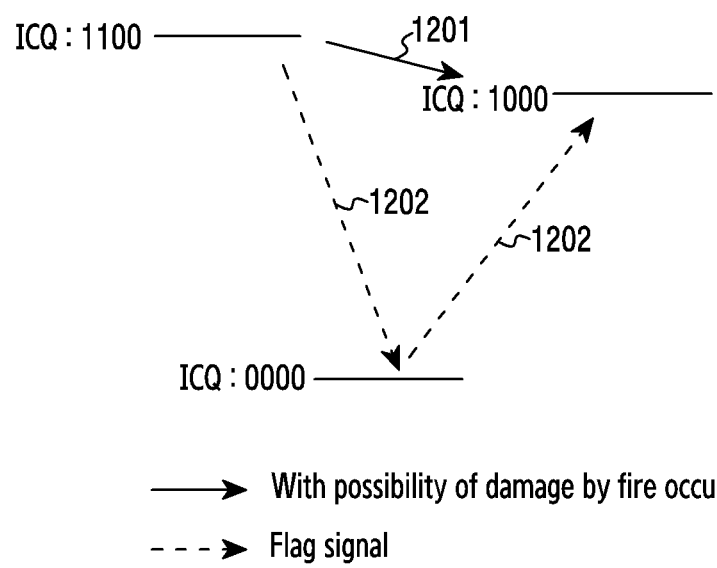
FIG. 12 illustrates an example of control for preventing a power amplifier from being damaged by a fire in an electronic device according to an embodiment.

FIG. 12 illustrates an example of control for preventing a power amplifier from being damaged by a fire in an electronic device according to an embodiment. FIG. 12 shows examples of changing an ICQ from 1100 to 1000, which illustrate cases where there is a possibility of a PA being damaged by a fire 1201 and there is no possibility of the PA being damaged by a fire 1202. When there is no possibility of the PA being damaged by a fire, the ICQ may transition from a current state 1100 to a target state 1000. When there is a possibility of the PA being damaged by a fire due to switching of at least one component, the ICQ may transition to a state in which there is a sufficiently low possibility of the PA being damaged by a fire (transition from 1100 to 0000). When a damage-causable switching operation that is likely to damage the PA by a fire is completed and then a flag signal is input, the ICQ may transition to the target state 1000.

Figure 13A:
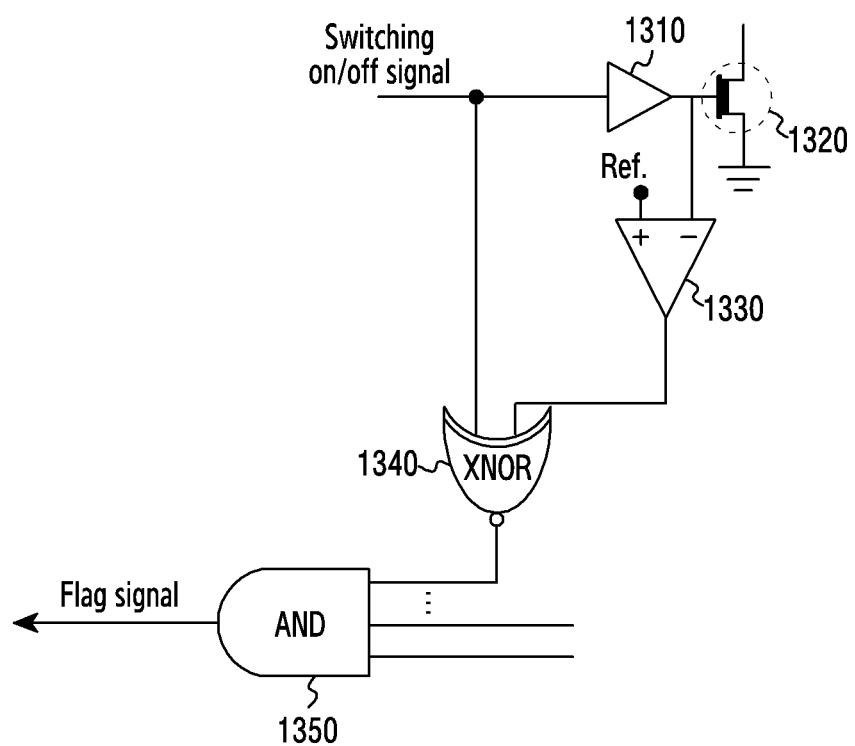
FIG. 13A illustrates an example of a circuit to generate a flag signal in an electronic device according to an embodiment.

FIG. 13A illustrates an example of a circuit to generate a flag signal in an electronic device according to an embodiment. In FIG. 13A, part of a circuit associated with one of components related to damage-causable switching is illustrated.

Referring to FIG. 13A, the circuit may include at least one of a buffer 1310, a switch 1320, a comparator 1330, an exclusive non-or (XNOR) gate 1340, and an AND gate 1350. The buffer 1310, the comparator 1330, and the XNOR gate 1340 is a set and may be formed for each component related to damage-causable switching. The switch 1320 is a component related to damage-causable switching and may be the first switch 326a or the second switch 326b that controls a notch filter.

The buffer 1310 may change a switching on/off signal for controlling the switch 322 to a signal having a magnitude necessary to control the switch 322. For example, the buffer 1310 may increase the voltage of the switching on/off signal. Output from the buffer 1310 may be applied to a gate of the switch 1320 and may also be input to the comparator 1330.

The comparator 1330 may compare the output from the buffer 1310 with a reference value and may output a comparison result. The XNOR gate 1340 may generate a signal to be input to one of input terminals of the AND gate 1350 based on the switching on/off signal and the output from the comparator 1330. The XNOR gate 1340 may output a signal indicating a positive value when the switching on/off signal and the output of the comparator 1330 are consistent with each other (e.g., 00 or 11). The AND gate 1350 may generate a flag signal based on signals input to the input terminals.

Figure 13B:
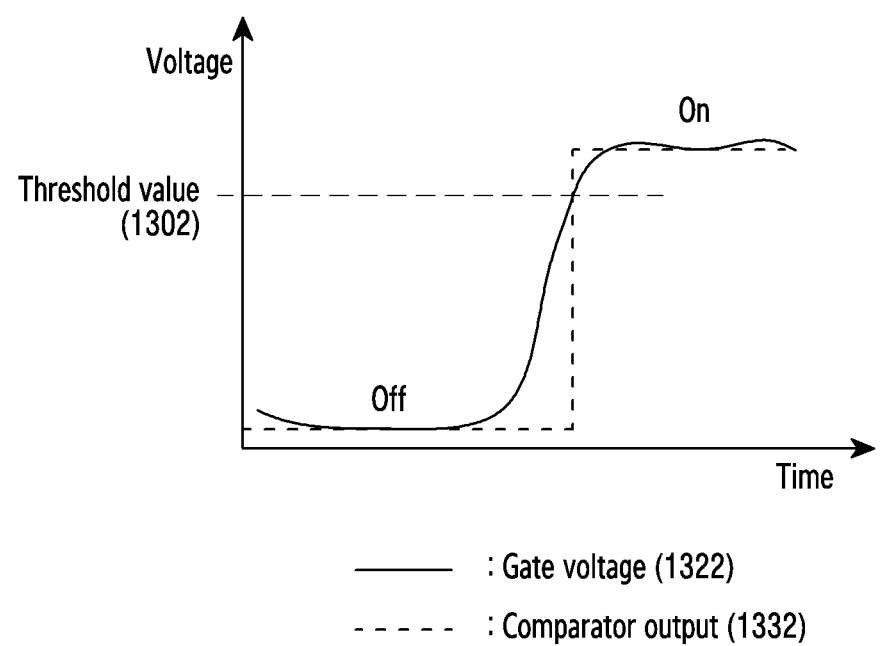
FIG. 13B illustrates examples of output from a buffer and a comparator in a circuit to generate a flag signal in an electronic device according to an embodiment.

FIG. 13B illustrates examples of output from a buffer and a comparator in a circuit to generate a flag signal in an electronic device according to an embodiment. Specifically, when the switch 1320 is transitioned from off to on by the switching on/off signal, the output from the buffer 1310 and the output from the comparator 1330 are as shown in FIG. 13B. As the switching on/off signal is generated, the gate voltage 1322 of the switch 1320 gradually increases, but the output 1332 from the comparator 1330 may change when the gate voltage 1322 exceeds a threshold value 1302. The output 1332 from the comparator 1330 changes at the time when the state of the switch 1320 transitions by the gate voltage 1322. Thus, when the state of the switch 1320 transitions, the output from the comparator 1330 is consistent with the switching on/off signal. Accordingly, the flag signal, generated by the AND gate 1350 based on the output from the XNOR gate 1340, cannot be generated before the time when the state of the switch 1320 transitions. That is, the flag signal can be generated after all switching operations related to all circuits connected to the input terminals of the AND gate 1350 are completed.

Figure 13C:
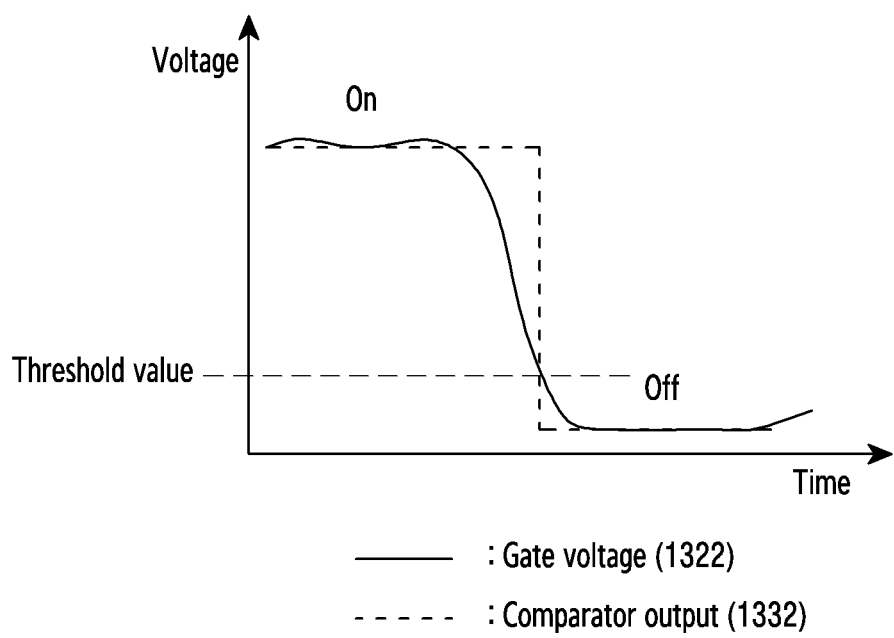
FIG. 13C illustrates an example of output from a buffer and a comparator in a circuit to generate a flag signal in an electronic device according to an embodiment.

FIG. 13C illustrates an example of output from a buffer and a comparator in a circuit to generate a flag signal in an electronic device according to an embodiment. Specifically, when the switch 1320 is transitioned from on to off by the switching on/off signal, the gate voltage 1322 and the output 1332 from the comparator 1330 are as shown in FIG. 13C. As the switching on/off signal ceases, the gate voltage 1322 gradually decreases, but the output 1332 from the comparator 1330 may change when the gate voltage 1322 decreases below a threshold value. The output 1332 from the comparator 1330 changes at the time when the state of the switch 1320 transitions by the gate voltage 1322. Thus, when the state of the switch 1320 transitions, the output 1332 from the comparator 1330 is consistent with the switching on/off signal. Accordingly, the flag signal, generated by the AND gate 1350 based on the output from the XNOR gate 1340, cannot cease before the time when the state of the switch 1320 transitions. That is, the flag signal can cease after all the switching operations related to all the circuits connected to the input terminals of the AND gate 1350 are completed.

As illustrated in FIG. 13B and FIG. 13C, when the gate voltage 1322 is changed from off to on, the comparator 1330 experiences hysteresis. Thus, when the gate voltage 1322 is greater than or equal to a median value, the output 1332 from the comparator 1330 may transition to on. When the gate voltage 1322 is changed from on to off, the comparator 1330 experiences hysteresis. Thus, when the gate voltage 1322 is less than or equal to the median value, the output 1332 from the comparator 1330 may transition to off. Accordingly, after the on/off operation of the switch 1320 is completely performed, the output 1332 from the comparator 1330 may transition from on to off or off to on.

Figure 14:
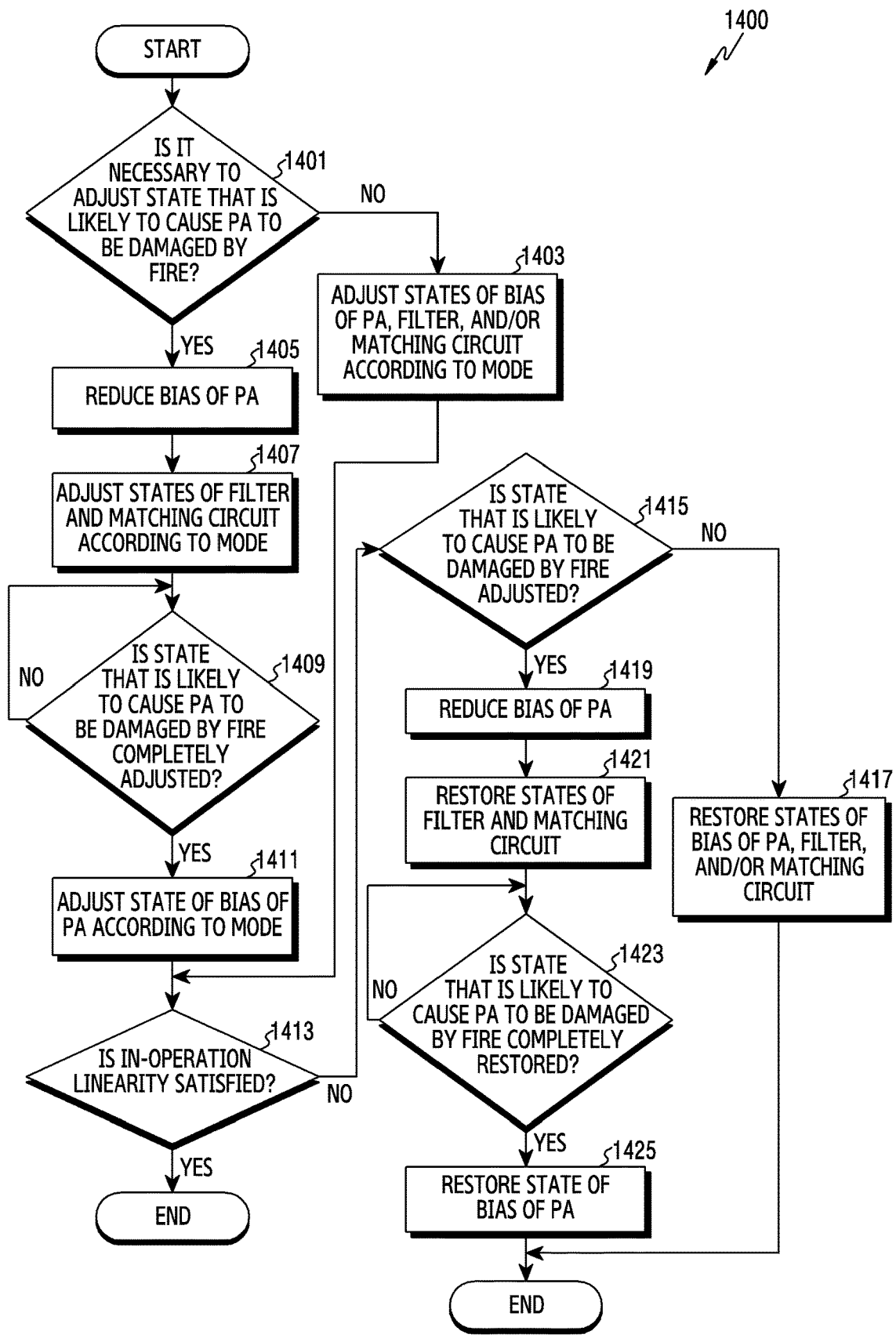
FIG. 14 illustrates a method for controlling the states of signal processing components in an electronic device according to an embodiment.

FIG. 14 illustrates a method 1400 for controlling the states of signal processing components in an electronic device according to an embodiment.

Referring to FIG. 14, in step 1401, the electronic device 101 may determine whether it is necessary to adjust a state that is likely to cause the PA to be damaged by a fire. The adjustment of the state may include turning on/off a switch, changing the value (e.g., capacitance) of a variable component, or changing the value of a signal (e.g., bias current) input to the component. For example, the electronic device 101 may determine whether a damage-causable switching operation that is likely to cause the PA to be damaged by a fire is necessary in order to transition to a mode for a current operation (e.g., a mode for an operation in the first state of FIG. 7, the second state of FIG. 7, the third state of FIG. 7, the first state of FIG. 8, the second of FIG. 8, the third state of FIG. 8, the fourth state of FIG. 8, the first state of FIG. 10, the second state of FIG. 10, or the third state of FIG. 10).

When it is not necessary to adjust the state that is likely to cause the PA to be damaged by a fire, the electronic device 101 may adjust the states of the bias of the PA, the filter, and/or the matching circuit according to the corresponding mode in step 1403. Since a damage-causable switching operation that is likely to cause the PA to be damaged by a fire is not performed, the electronic device 101 may perform the state adjustment necessary for the corresponding mode without adjusting the bias of the PA to a stable state.

When it is necessary to adjust the state that is likely to cause the PA to be damaged by a fire, the electronic device 101 may reduce the bias of the PA in step 1405. Since a damage-causable switching operation that is likely to cause the PA to be damaged by a fire is performed, the electronic device 101 may shift the bias of the PA to the stable state before adjusting the state.

In step 1407, the electronic device 101 may adjust the states of the filter and the matching circuit according to the mode. In step 1409, the electronic device 101 may identify whether the state that is likely to cause the PA to be damaged by a fire is completely adjusted. For example, the electronic device 101 may identify whether the state that is likely to cause the PA to be damaged by a fire is completely adjusted based on a flag signal. When the state that is likely to cause the PA to be damaged by a fire is completely adjusted, the electronic device 101 may adjust the state of the bias of the PA according to the mode in step 1411.

In step 1413, the electronic device 101 may determine whether performance (e.g., linearity) for the operation is satisfied. With the states of filter switching, the matching circuit, and/or the bias of the PA set according to the mode, the electronic device 101 may measure the performance based on output of the PA that is fed back and may determine whether the measured performance satisfies a performance level required by a network. For example, the electronic device 101 may determine whether the performance satisfies the performance level required by the network by comparing a performance index (e.g., ACLR or EVM) measured during the operation with a threshold value corresponding to the network.

When the performance for the operation is not satisfied, the electronic device 101 may determine whether the state that is likely to cause the PA to be damaged by a fire is adjusted in step 1415. The electronic device 101 may determine whether the adjustment of the state that is likely to cause the PA to be damaged by a fire is included in adjustment of a state to return for restoration.

In step 1417, when the electronic device 101 determines the state that is likely to cause the PA to be damaged by a fire is not adjusted in step 1415, the electronic device 101 may restore the states of the bias of the PA, the filter, and/or the matching circuit. Since a damage-causable switching operation that is likely to cause the PA to be damaged by a fire is not required for restoration to a mode before the change, the electronic device 101 may perform state restoration without adjusting the bias of the PA to the stable state. For example, the electronic device 101 may restore the states of the bias of the PA, the filter, and/or the matching circuit to the states prior to step 1403.

In step 1419, when the electronic device 101 determines the state that is likely to cause the PA to be damaged by a fire is adjusted in step 1415, the electronic device 101 may reduce the bias of the PA. Since a damage-causable switching operation that is likely to cause the PA to be damaged by a fire is performed, the electronic device 101 may shift the bias of the PA to the stable state before state restoration.

In step 1421, the electronic device 101 may restore the states of the filter and/or the matching circuit. For example, the electronic device 101 may restore the states of the filter and/or the matching circuit to those prior to step 1407. In step 1423, the electronic device 101 may identify whether the state that is likely to cause the PA to be damaged by a fire is completely restored. When the state that is likely to cause the PA to be damaged by a fire is completely restored, the electronic device 101 may restore the state of the bias of the PA in step 1425. For example, the electronic device 101 may restore the state of the bias of the PA to the state prior to step 1405. If the state that is likely to cause the PA to be damaged by a fire is not completely restored, the electronic device 101 repeats step 1423.

According to an embodiment, an electronic device includes a PA configured to amplify a transmission signal, a matching circuit configured to be connected with the PA and to form a load impedance, a filter configured to be connected with the matching circuit, an antenna switch configured to be connected with the filter, and a control circuit configured to control states of a bias of the PA, the matching circuit, the filter, and the antenna switch, wherein, when it is necessary to adjust a state that is likely to cause the PA to be damaged by a fire in order to transition to a mode for an operation, the control circuit may adjust the bias of the PA to a predefined value before adjusting the state, may adjust the state, and may adjust the bias of the PA to a value according to the mode.

Adjusting the state that is likely to cause the PA to be damaged by the fire may include at least one of adjusting the antenna switch or adjusting a switch included in the filter.

The control circuit may adjust the bias of the PA to the value according to the mode after the value of a first signal for adjusting the state and the value of a second signal applied to a component that is a target for adjusting the state are consistent with each other.

The control circuit may include a control signal generator configured to output the first signal for adjusting the state, a buffer configured to generate the second signal applied to the component that is the target for adjusting the state based on the first signal, a comparator configured to compare the second signal with a reference value, and an XNOR gate configured to output a signal having a positive value when output from the comparator and the second signal are consistent with each other.

The electronic device may perform a CA operation. In a CA operation using a first band and a second band, it is preferable that a signal transmitted in the first band causes less interference to the second band. Therefore, the electronic device may use an antenna configuration defined such that the attenuation level of transmission in the first band to reception in the second band is high. In this case, greater insertion loss in the first band may be incurred than when CA is not performed. That is, the antenna configuration for the CA operation may not be optimized for performance in the first band.

Therefore, when an antenna configuration is selectively adjusted according to whether a CA operation is activated, performance in the first band may be improved.

Figure 15:
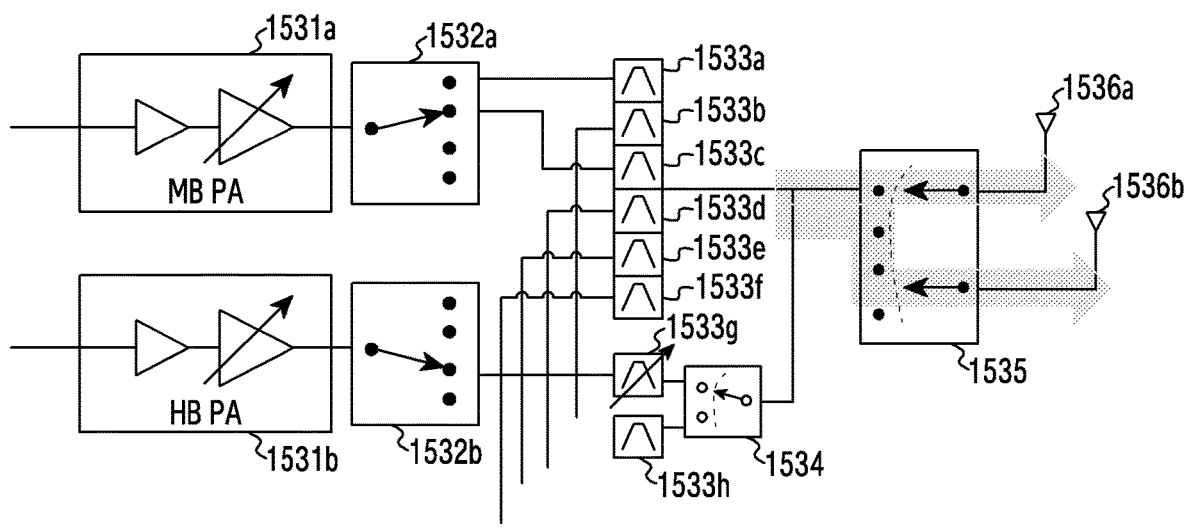
FIG. 15 is an example of the configuration of a communication module for supporting a plurality of antenna configurations in an electronic device according to an embodiment.

FIG. 15 is an example of the configuration of a communication module 190 for supporting a plurality of antenna configurations in an electronic device 101 according to an embodiment. Referring to FIG. 15, the communication module 190 may include a middle band (MB) PA 1531a, a high band (HB) PA 1531b, an MB switch 1532a, an HB switch 1532b, a plurality of filters 1533a to 1533h, a filter switch 1534, and/or an antenna switch 1535. The antenna switch 1535 may be connected to a first antenna 1536a, used when a CA operation is activated, and a second antenna 1536b, used when the CA operation is deactivated.

The MB PA 1531a may amplify a signal in a second band belonging to an intermediate frequency band. The HB PA 1531b may amplify a signal in a first band belonging to a high frequency band. The MB switch 1532a may connect the MB PA 1531a and a filter corresponding to the signal in the second band among the plurality of filters 1533a to 1533h. The HB switch 1532b may connect the HB PA 1531b and a filter corresponding to the signal in the first band among the plurality of filters 1533a to 1533h. The filter switch 1534 may connect one of the filters 1533g and 1533h with the antenna switch 1535. The antenna switch 1535 may connect one of the first antenna 1536a and the second antenna 1536b with a transmission path. The antenna switch 1535 may be controlled to select an antenna configuration.

Figure 16:
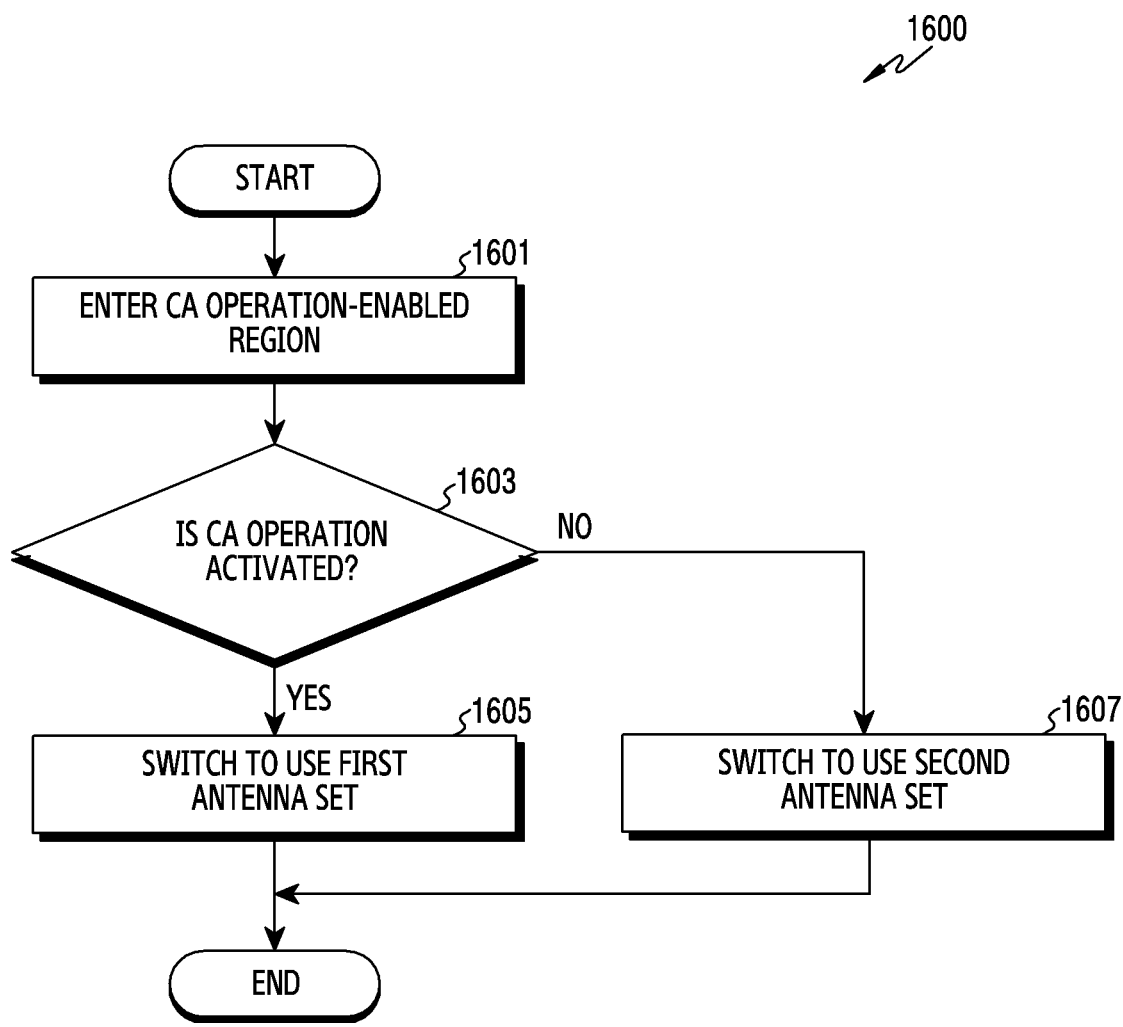
FIG. 16 illustrates a method for controlling an antenna according to whether a carrier aggregation (CA) operation is activated in an electronic device according to an embodiment.

FIG. 16 illustrates a method 1600 for controlling an antenna according to whether a CA operation is activated in an electronic device according to an embodiment.

Referring to FIG. 16, in step 1601, the electronic device 101 may enter a CA operation-enabled region. A CA operation may be performed depending on whether a network supports a CA operation. The electronic device 101 may enter the coverage of a network supporting a CA operation as a user moves.

In step 1603, the electronic device 101 may identify whether the CA operation is activated. The activation of the CA operation may be determined by the CP 210. The CA operation may be activated according to the control of a base station.

When the CA operation is activated, the electronic device 101 may perform switching to use a first antenna set (e.g., the first antenna 1536a) in step 1605. When the CA operation is activated when a first band and a second band are used, the electronic device 101 may use an antenna configuration optimized for simultaneous use of the first band and the second band. For example, when the electronic device 101 includes an adjustable filter, the electronic device 101 may control the filter to pass signals in the first band and the second band.

When the CA operation is not activated, in step 1607, the electronic device 101 may perform switching to use a second antenna set (e.g., the second antenna 1536b). When the CA operation is not activated when only the first band is used, the electronic device 101 may use an antenna configuration optimized for the first band. For example, when the electronic device 101 includes an adjustable filter, the electronic device 101 may control the filter to pass a signal in the first band. In another example, when the CA operation is not activated when only the first band is used, since an attenuation condition for the second band is eased compared to when the CA operation is activated, the electronic device 101 may adjust the filter to reduce insertion loss in the first band.

Herein, an RF-FEM 230 may include a PA 231. The PA may operate according to the ET amplification method, which is a technique for generating a bias current based on the envelope of a transmission signal.

Figure 17:
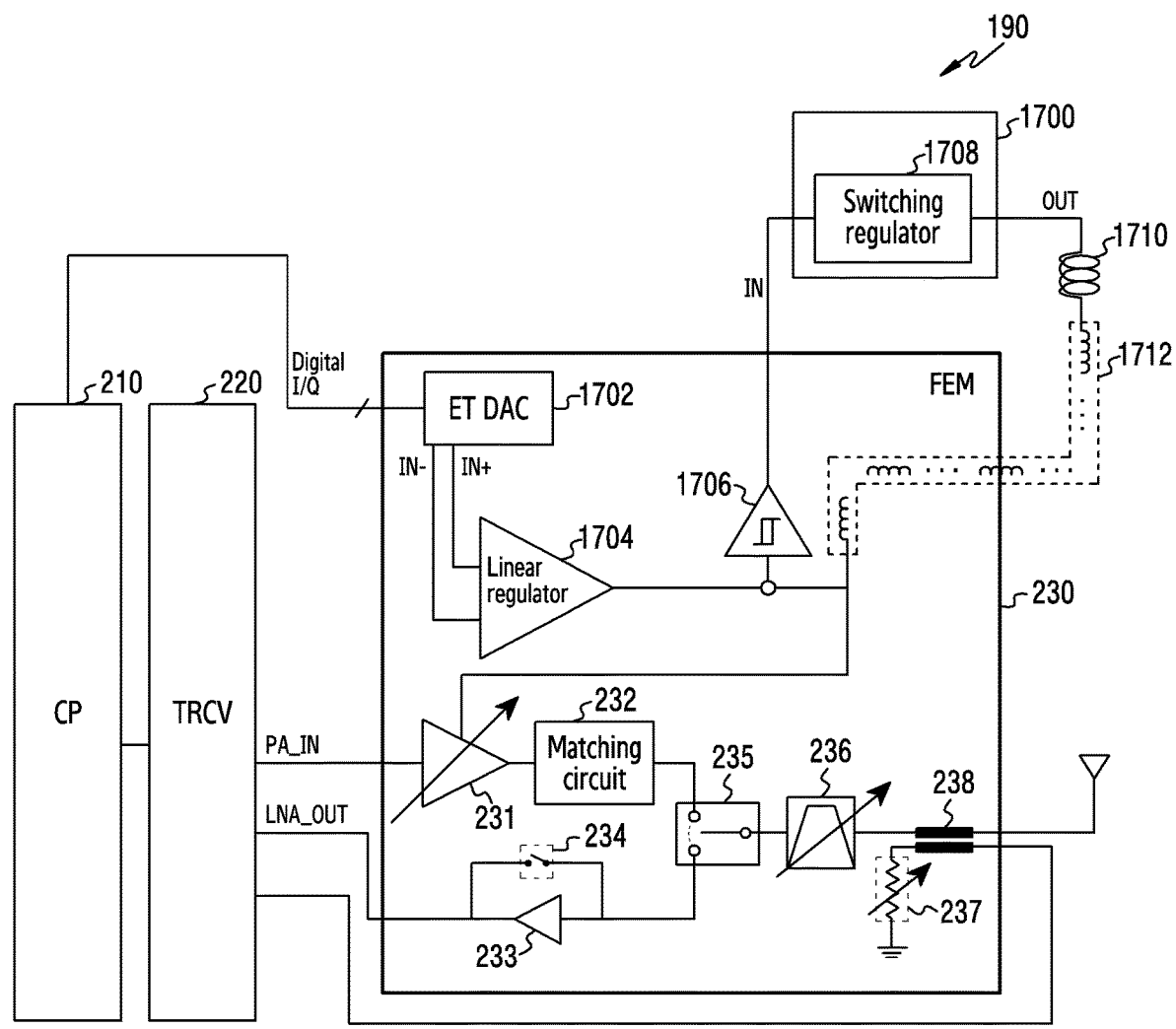
FIG. 17 illustrates an example of the configuration of a communication module employing an envelope tracking (ET) amplification method in an electronic device according to an embodiment.

FIG. 17 illustrates an example of the configuration of a communication module 190 employing an ET amplification method in an electronic device according to an embodiment. Referring to FIG. 17, the communication module 190 may include a CP 210, a transceiver (TRCV) 220, an RF-FEM 230, and/or an ET modulator 1700. The RF-FEM 230 may include a PA 231, a matching circuit 232, an LNA 233, a bypass switch 234, a transceiving switch 235, a filter 236, a variable resistor 237, and/or a coupler 238. As a circuit for supplying the bias current of the PA 231, an ET digital to analog converter (ET DAC) 1702, a linear regulator 1704, a comparator 1706, a switching regulator 1708, and/or an inductor 1710 may be included.

The ET DAC 1702, the linear regulator 1704, and the comparator 1706 may be included in the RF-FEM 230. The ET DAC 1702 may convert a digital envelope signal provided from the CP 210 into an analog envelope signal. The linear regulator 1704 may be provided with an in-phase (I) signal with a phase of 0 degrees and a quadrature (Q) signal with a phase of 90 degrees. The linear regulator 1704 may track a high frequency band signal of an envelope signal and may generate at least a portion (e.g., a high frequency component) of the bias current of the PA 231 based on the high frequency band signal. The comparator 1706 may compare output from the linear regulator 1704 and output from the switching regulator 1708 and may output a digital value of 0 or 1 according to the comparison result. The output from the comparator 1706 is used to control the switching operation of the switching regulator 430.

The switching regulator 1708 may be included in an ET modulator 1700. The switching regulator 1708 may operate at a lower speed than the linear regulator 1704 and may generate a portion (e.g., a low frequency component) of a bias signal applied to the PA 231. The switching regulator 1708 may generate the portion of the bias signal by performing a switching operation according to the output from the comparator 1706. For example, when the switching regulator 1708 turns on an internal switching element (e.g., a transistor), power may be supplied to an output terminal (OUT) of the ET modulator 1700 through the inductor 1710. When the switching regulator 1708 turns off the switching element, charged power may be supplied to the inductor 1710. When the switching element is turned on, output power may increase, whereas when the switching element is turned off, the output power may decrease.

As described with reference to FIG. 17, the sum of the output from the linear regulator 1704 and output from the switching regulator 1708 delivered through a path 1712 may be applied as the bias current of the PA 231. Since the path 1712 has a certain length, an inductance corresponding to the length may be generated by a trace. However, even though a low frequency signal output from the switching regulator 1708 is distorted by the trace, the linear regulator 1704 generates an envelope signal by performing regulation, thus compensating for the distortion due to the path 1712.

The ET DAC 1702 may be disposed inside the RF-FEM 230 rather than in the CP 210 or the transceiver 220. Accordingly, distortion that occurs while the analog envelope signal is transmitted to the linear regulator 1704 may be reduced compared to when the ET DAC 1702 is disposed in the CP 210 or the transceiver 220.

According to an embodiment, an electronic device includes an ET DAC configured to convert a digital envelope signal into an analog envelope signal, a linear regulator configured to generate a portion of a bias signal applied to the PA based on the analog envelope signal, a switching regulator configured to generate a remaining portion of the bias signal, and a comparator configured to generate a signal to control a switching operation of the switching regulator based on output from the linear regulator and output from the switching regulator, wherein the DAC, the linear regulator, and the comparator may be included in the same module (e.g., the RF-FEM) as the PA.

As used herein, the term "module" may include a unit implemented in hardware, software, or firmware, or any combination thereof, and may interchangeably be used with other terms "logic," "logic block," "part," or "circuitry". A module may be a single integral component, or a minimum unit or part thereof, adapted to perform one or more functions. For example, the module may be implemented in a form of an application-specific integrated circuit (ASIC).

Embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke and execute at least one of the one or more instructions stored in the storage medium, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal, but this term does not differentiate between where data is semi-permanently stored in the storage medium and where the data is temporarily stored in the storage medium.

A method according to embodiments of the disclosure may be included and provided in a computer program product that may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be performed sequentially, in parallel, repeatedly, or heuristically, one or more of the operations may be executed in a different order or omitted, or one or more other operations may be added.

While the disclosure has been shown and described with reference to embodiments thereof, it will be understood by those skilled in the art that various changes in form and details may be made therein without departing from the sprit and scope of the disclosure as defined by the appended claims and their equivalents.

What is claimed is:
1. An electronic device comprising:
a power amplifier (PA) configured to amplify a transmission signal;
a matching circuit configured to be connected with the PA and to form a load impedance;
a filter configured to be connected with the matching circuit; and
a control circuit configured to control a state of at least one of a bias of the PA, the matching circuit, and the filter,
wherein the matching circuit is configured to operate in one of a first state, a second state, and a third state,
wherein the first state is defined to have a linearity corresponding to a requirement of a first network at a module level,
wherein the second state is defined to have a linearity corresponding to a requirement of a second network at the module level, the first network requiring a higher linearity than the second network,
wherein the third state provides a linearity that is lower than the linearity in the first state and is higher than the linearity in the second state and provides an efficiency that is higher than an efficiency in the first state and is lower than an efficiency in the second state, and
wherein the control circuit is configured to:

identify a network to which the electronic device is connected between the first network and the second network, control the matching circuit to operate in the first state when the identified network is the first network, and control the matching circuit to operate in the second state when the identified network is the second network.

2. The electronic device of claim 1, wherein, after controlling the matching circuit to operate in the second state, when a linearity measured with the matching circuit to operate in the second state does not satisfy the requirement of the second network, the control circuit is further configured to control the matching circuit to operate in the third state.

3. The electronic device of claim 2, wherein, after controlling the matching circuit to operate in the third state, when a linearity measured with the matching circuit to operate in the third state does not satisfy the requirement of the second network, the control circuit is further configured to control the matching circuit to operate in the first state.

4. The electronic device of claim 2, wherein, after controlling the matching circuit to operate in the third state, when a linearity measured with the matching circuit to operate in the third state does not satisfy the requirement of the second network, the control circuit is further configured to control the matching circuit to operate in a fourth state, and wherein the fourth state provides a linearity that is lower than the linearity in the first state and is higher than the linearity in the third state and provides an efficiency that is higher than the efficiency in the first state and is lower than the efficiency in the third state.

5. The electronic device of claim 1, further comprising:

a coupler configured to couple the transmission signal having passed through the filter, wherein the control circuit is further configured to measure an in-operation linearity using the signal coupled by the coupler.

6. The electronic device of claim 1, further comprising:

a digital-to-analog converter (DAC) configured to convert a digital envelope signal into an analog envelope signal;

a linear regulator configured to generate a portion of a bias signal applied to the PA based on the analog envelope signal;

a switching regulator configured to generate a remaining portion of the bias signal; and a comparator configured to generate a signal to control a switching operation of the switching regulator based on output from the linear regulator and output from the switching regulator, wherein the DAC, the linear regulator, and the comparator are comprised in a same module as the PA.

7. An electronic device comprising:

a power amplifier (PA) configured to amplify a transmission signal using a plurality of amplifiers connected in parallel;

a matching circuit configured to be connected with the PA and to form a load impedance; and a control circuit configured to control a state of a bias of the PA or the matching circuit, wherein the matching circuit is configured to operate in one of a first state, a second state, and a third state, wherein the first state is defined to have a linearity corresponding to a requirement of a network at a module level and to enable the matching circuit to form a first impedance, wherein the second state is defined to have the linearity corresponding to the requirement of the network at the module level and to enable the matching circuit to form a second impedance that is higher than the first impedance, wherein the third state is defined to have the linearity corresponding to the requirement of the network at the module level and to enable the matching circuit to form a third impedance that is higher than the first impedance and is lower than the second impedance, and wherein the control circuit is configured to:

identify a power mode to be used among a first power mode and a second power mode, the first power mode using a higher transmission power than the second power mode, control all of the plurality of amplifiers comprised in the PA to be turned on and control the matching circuit to operate in the first state when the identified power mode is the first power mode, and control a first subset among the plurality of amplifiers comprised in the PA to be turned on and control the matching circuit to operate in the second state when the identified power mode is the second power mode.

8. The electronic device of claim 7, wherein, after controlling the matching circuit to operate in the second state, when a linearity measured with the matching circuit to operate in the second state does not satisfy the requirement of the network, the control circuit is further configured to control a second subset, which comprises a greater number of amplifiers than the first subset among the plurality of amplifiers comprised in the PA, to be turned on and control the matching circuit to operate in the third state.

9. The electronic device of claim 8, wherein, after controlling the matching circuit to operate in the third state, when a linearity measured with the matching circuit to operate in the third state does not satisfy the requirement of the network, the control circuit is further configured to control all the amplifiers comprised in the PA to be turned on and to control the matching circuit to operate in the first state.

10. The electronic device of claim 8, wherein, after controlling the matching circuit to operate in the third state, when a linearity measured with the matching circuit to operate in the third state does not satisfy the requirement of the network, the control circuit is further configured to control a third subset, which comprises a greater number of amplifiers than the second subset among the plurality of amplifiers comprised in the PA, to be turned on and to control the matching circuit to operate in a fourth state, and wherein the fourth state forms an impedance that is higher than the impedance in the first state and is lower than the impedance in the third state.

11. The electronic device of claim 7, further comprising:

a digital-to-analog converter (DAC) configured to convert a digital envelope signal into an analog envelope signal;

a linear regulator configured to generate a portion of a bias signal applied to the PA based on the analog envelope signal;

a switching regulator configured to generate a remaining portion of the bias signal; and a comparator configured to generate a signal to control a switching operation of the switching regulator based on output from the linear regulator and output from the switching regulator,
wherein the DAC, the linear regulator, and the comparator are comprised in a same module as the PA.

12. An electronic device comprising:
a power amplifier (PA) configured to amplify a transmission signal;
a matching circuit configured to be connected with the PA and to form a load impedance;
a filter configured to be connected with the matching circuit;
an antenna switch configured to be connected with the filter; and
a control circuit configured to control states of a bias of the PA, the matching circuit, the filter, and the antenna switch,
wherein, when it is necessary to adjust a state that is determined to be a fire-causing state for the PA in order to transition to a mode for an operation, the control circuit is configured to adjust the bias of the PA to a predefined value before adjusting the state, to adjust the state, and to adjust the bias of the PA to a value according to the mode.

13. The electronic device of claim 12,
wherein adjusting the state that is determined to be a fire-causing state for the PA comprises at least one of adjusting the antenna switch and adjusting a switch comprised in the filter.

14. The electronic device of claim 12,
wherein the control circuit is further configured to adjust the bias of the PA to the value according to the mode after a value of a first signal for adjusting the state and a value of a second signal applied to a component that is a target for adjusting the state are consistent with each other.

15. The electronic device of claim 14,
wherein the control circuit comprises:
a control signal generator configured to output the first signal for adjusting the state;
a buffer configured to generate the second signal applied to the component that is the target for adjusting the state based on the first signal;
a comparator configured to compare the second signal with a reference value; and
an exclusive non-or (XNOR) gate configured to output a signal having a positive value when output from the comparator and the second signal are consistent with each other.

16. The electronic device of claim 12, further comprising:
a digital-to-analog converter (DAC) configured to convert a digital envelope signal into an analog envelope signal;
a linear regulator configured to generate a portion of a bias signal applied to the PA based on the analog envelope signal;
a switching regulator configured to generate a remaining portion of the bias signal; and
a comparator configured to generate a signal to control a switching operation of the switching regulator based on output from the linear regulator and output from the switching regulator,
wherein the DAC, the linear regulator, and the comparator are comprised in a same module as the PA.

* * * * *